United States Patent
Han

(10) Patent No.: US 12,333,113 B2
(45) Date of Patent: Jun. 17, 2025

(54) TOUCH SENSING UNIT AND DISPLAY DEVICE INCLUDING THE SAME

(71) Applicant: SAMSUNG DISPLAY CO., LTD., Yongin-si (KR)

(72) Inventor: In Young Han, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 16 days.

(21) Appl. No.: 16/287,289

(22) Filed: Feb. 27, 2019

(65) Prior Publication Data

US 2020/0089350 A1 Mar. 19, 2020

(30) Foreign Application Priority Data

Sep. 19, 2018 (KR) .................... 10-2018-0112009

(51) Int. Cl.
*G06F 3/044* (2006.01)
*G06F 3/041* (2006.01)
*H10K 59/40* (2023.01)

(52) U.S. Cl.
CPC ............ *G06F 3/044* (2013.01); *G06F 3/0412* (2013.01); *G06F 3/04164* (2019.05); *G06F 3/0443* (2019.05); *G06F 3/0448* (2019.05); *H10K 59/40* (2023.02); *G06F 3/0416* (2013.01); *G06F 2203/04107* (2013.01); *G06F 2203/04111* (2013.01)

(58) Field of Classification Search
None
See application file for complete search history.

(56) References Cited

U.S. PATENT DOCUMENTS

| 8,638,313 | B2 | 1/2014 | Kinoshita et al. |
| 9,214,297 | B2* | 12/2015 | Xie ............... G06F 3/044 |
| 9,535,521 | B2* | 1/2017 | Chang ............ G06F 3/041 |
| 2010/0073319 | A1* | 3/2010 | Lyon ............ H03K 17/9622 345/174 |

(Continued)

FOREIGN PATENT DOCUMENTS

| CN | 106990878 | 7/2017 |
| CN | 108008850 | 5/2018 |

(Continued)

OTHER PUBLICATIONS

Korean Office Action dated May 12, 2023 in corresponding Korean Patent Application No. 10-2018-01120009 (7 pages).

(Continued)

*Primary Examiner* — Benjamin X Casarez
(74) *Attorney, Agent, or Firm* — F. CHAU & ASSOCIATES, LLC

(57) ABSTRACT

According to an exemplary embodiment of the present invention, a touch sensing unit includes a touch driving wiring and a sensing electrode unit including a driving electrode pattern connected to the touch driving wiring and a sensing electrode pattern with a rounded corner. The touch driving wiring includes a junction portion connected to the driving electrode pattern and a wiring portion extending from the junction portion and bypassing the sensing electrode unit along the rounded corner of the sensing electrode pattern. A line width of the junction portion is greater than a line width of the wiring portion.

1 Claim, 18 Drawing Sheets

(56) References Cited

U.S. PATENT DOCUMENTS

| | | | | |
|---|---|---|---|---|
| 2011/0316803 A1* | 12/2011 | Kim | .................. | G06F 3/044 |
| | | | | 345/173 |
| 2013/0170152 A1* | 7/2013 | Wu | .................. | G06F 3/044 |
| | | | | 361/748 |
| 2014/0368755 A1* | 12/2014 | Chen | .................. | G06F 3/0448 |
| | | | | 349/12 |
| 2015/0185903 A1* | 7/2015 | Park | .................. | G06F 3/044 |
| | | | | 345/173 |
| 2015/0346865 A1* | 12/2015 | Hong | .................. | G06F 3/044 |
| | | | | 345/174 |
| 2016/0070396 A1* | 3/2016 | Horade | .............. | G06F 3/0446 |
| | | | | 345/174 |
| 2016/0139728 A1* | 5/2016 | Jeon | .................. | G06F 3/0448 |
| | | | | 345/173 |
| 2017/0123572 A1* | 5/2017 | Song | .................. | G06F 3/0446 |
| 2018/0120988 A1* | 5/2018 | Kim | .................. | G06F 3/0418 |
| 2018/0348929 A1* | 12/2018 | Rhe | .................. | G06F 3/047 |
| 2018/0356668 A1* | 12/2018 | Koide | ................ | G06F 3/044 |
| 2019/0146621 A1* | 5/2019 | Aoki | .................. | G06F 3/044 |
| | | | | 345/174 |
| 2019/0220123 A1* | 7/2019 | Kanaya | .............. | G06F 3/0443 |
| 2019/0227650 A1* | 7/2019 | Fang | .................. | G06F 3/044 |
| 2019/0286272 A1* | 9/2019 | Feng | .................. | G06F 3/0412 |
| 2019/0354240 A1* | 11/2019 | Wang | ................ | G06F 3/0446 |
| 2019/0369781 A1* | 12/2019 | Hwang | .............. | G06F 3/047 |
| 2019/0369833 A1* | 12/2019 | Kubo | ................ | G06F 3/04164 |
| 2020/0012364 A1* | 1/2020 | Ye | .................... | G06F 3/04164 |
| 2020/0033997 A1* | 1/2020 | Wang | ................ | G06F 3/0443 |

FOREIGN PATENT DOCUMENTS

| | | |
|---|---|---|
| CN | 108509076 | 9/2018 |
| JP | 2009258935 | 11/2009 |
| JP | 2013045246 | 3/2013 |
| KR | 20-2011-0002164 | 3/2011 |
| KR | 10-2013-0046263 | 5/2013 |
| KR | 10-2015-0120169 | 10/2015 |
| KR | 10-2017-0051789 | 5/2017 |
| KR | 10-2018-0046442 | 5/2018 |

OTHER PUBLICATIONS

Chinese Office Action dated Oct. 26, 2023, in Corresponding Chinese Patent Application No. 201910374673.6 (9 pages).

* cited by examiner

TOUCH SENSING UNIT AND DISPLAY DEVICE INCLUDING THE SAME

This application claims priority under 35 U.S.C. § 119 to Korean Patent Application No. 10-2018-0112009, filed on Sep. 19, 2018 in the Korean Intellectual Property Office, the disclosure of which is incorporated by reference herein in its entirety.

BACKGROUND

1. Field of the Invention

The present invention relates to a touch sensing unit and a display device including the same.

2. Description of the Related Art

To increase a screen to body ratio, smart phones have a display area having a notch or trench shape in a plan view to provide components such as a speaker and an optical sensor other than pixels for display. The display area may display information and also receive a human input by pushing or touching the display area.

SUMMARY

According to an exemplary embodiment of the present invention, a touch sensing unit includes a touch driving wiring and a sensing electrode unit including a driving electrode pattern connected to the touch driving wiring and a sensing electrode pattern with a rounded corner. The touch driving wiring includes a junction portion connected to the driving electrode pattern and a wiring portion extending from the junction portion and bypassing the sensing electrode unit along the rounded corner of the sensing electrode pattern. A line width of the junction portion is greater than a line width of the wiring portion.

According to an exemplary embodiment of the present invention, a display device includes a base layer including a sensing area with rounded corners and a non-sensing area surrounding the sensing area, driving electrode patterns disposed in the sensing area and arranged in a first direction, sensing electrode patterns disposed in the sensing area and arranged in a second direction intersecting the first direction, touch sensing wirings disposed in the non-sensing area and touch driving wirings disposed in the non-sensing area. Each of the touch sensing wirings is connected to one of the sensing electrode patterns. Each of the touch driving wirings is connected to one of the driving electrode patterns. The driving electrode patterns include a first driving electrode pattern disposed adjacent to the rounded corner. The touch driving wirings include a first touch driving wiring connected to the first driving electrode pattern. The first touch driving wiring includes a junction portion connected to the first driving electrode pattern and a wiring portion bypassing the sensing area. The wiring portion has a first line width defined in a direction intersecting an extending direction of the wiring portion. The junction portion has a second line width greater than the first line width.

According to an exemplary embodiment of the present invention, a display device includes a base layer including a sensing area and a non-sensing area surrounding the sensing area, a first driving electrode pattern and a second driving electrode pattern are adjacent to a boundary of the sensing area and the non-sensing area and spaced apart from each other in the sensing area, a sensing electrode pattern is adjacent to the boundary and between the first and second driving electrode patterns, an island electrode is disposed within the sensing electrode pattern and electrically isolated therefrom, a driving bridge electrode portion connects the first driving electrode pattern and the second driving electrode pattern to the island electrode, a first touch driving wiring is disposed in the non-sensing area and connected to the first driving electrode pattern, and a second touch driving wiring is disposed in the non-sensing area and connected to the second driving electrode pattern. The first touch driving wiring includes a first junction portion connected to the first driving electrode pattern and a first wiring portion extending from the first junction portion. The first junction portion has a first line width and the first wiring portion has a second line width. The first line width is greater than the second line width.

However, aspects of the present invention are not restricted to the one set forth herein. The above and other aspects of the present invention will become more apparent to one of ordinary skill in the art to which the present invention pertains by referencing the detailed description of the present invention given below.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1:
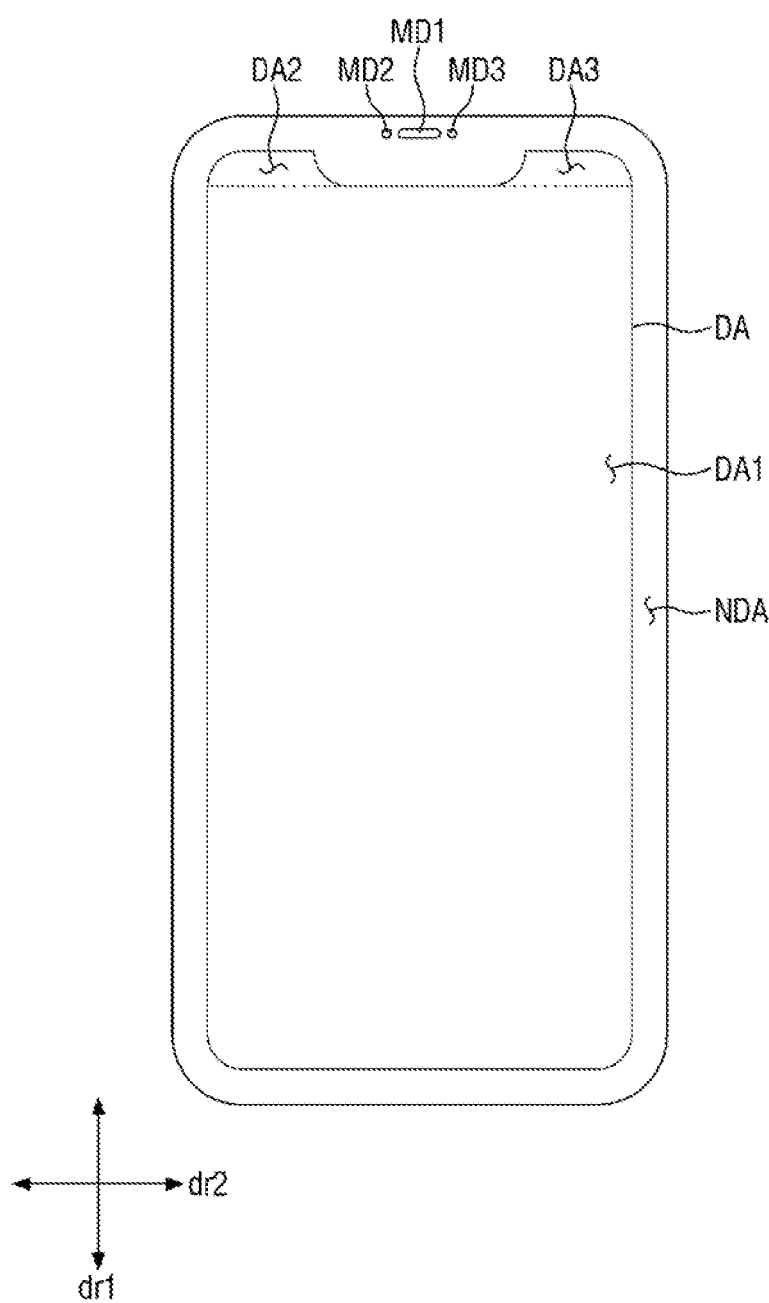
FIG. 1 is a plan view of an organic light emitting display device according to an embodiment of the present invention.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

A display device according to various embodiments of the present invention is a device for displaying a moving image or a still image, or a device for displaying a stereoscopic image, and may be used as a display screen for various products such as televisions, notebook computers, monitors, billboards, and things of internet as well as portable electronic appliances such as mobile communication terminals, smart phones, tablet PCs, smart watches, and navigators.

Hereinafter, embodiments of the present invention will be described with reference to the attached drawings. Hereinafter, an organic light emitting display device will be described as an example of a display device. However, the present invention is not limited thereto, and may be applied to other display devices such as a liquid crystal display device, a field emission display device, an electrophoretic device, a quantum dot light emitting display device, and micro LED display device without changing the spirit of the invention. The same or similar reference numerals are used for the same components in the drawings.

Figure 2:
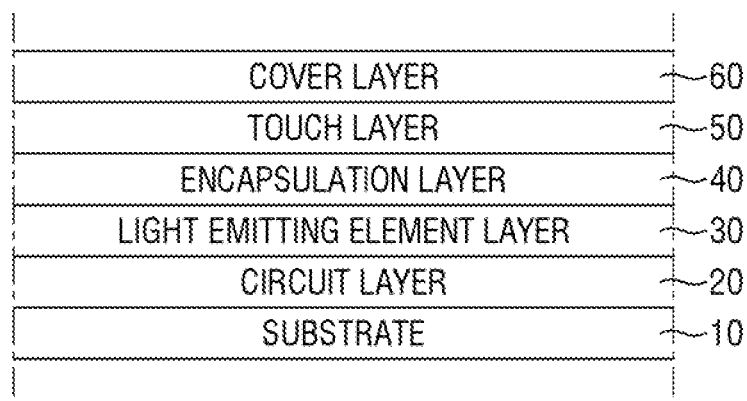
FIG. 2 is a schematic cross-sectional view of an organic light emitting display device according to an embodiment of the present invention.

FIG. 1 is a plan view of an organic light emitting display device according to an embodiment of the present invention. FIG. 2 is a schematic cross-sectional view of an organic light emitting display device according to an embodiment of the present invention.

Referring to FIG. 1, an organic light emitting display device 1 has a rectangular shape in which a length in a first direction dr1 is longer than a length in a second direction dr2. For example, the rim of the organic light emitting display device 1 includes long sides extending in the first direction dr1 and short sides extending in the second direction dr2. The rim of the organic light emitting display device 1 includes a curved corner between adjacent long and short sides.

As used herein, for convenience of explanation, the longitudinal direction is defined as a first direction dr1, and the direction intersecting the first direction dr1 is defined as a second direction dr2. That is, the second direction dr2 indicates the horizontal direction in the drawings. However, in embodiments, the present invention is not limited to the aforementioned directions, and it should be understood that the first direction dr1 and the second direction dr2 refer to relative directions intersecting each other. Further, for convenience of explanation, based on the center of the drawing, the upper side is defined as one side of the first direction dr1, the lower side is defined as the other side of the first direction dr1, the left side is defined as one side of the second direction dr2, and the right side is defined as the other side of the second direction dr2. However, it is obvious that these positions are relative positions.

The organic light emitting display device 1 includes a display area DA and a non-display area NDA.

The display area DA is defined as an area where an image is displayed. The organic light emitting display device 1 may include a plurality of pixels in the display area DA. The display area DA may be used not only as an area for displaying an image but also as an area for recognizing a user's touch input or fingerprint. In an embodiment, the display area DA has one side edge (for example, upper edge in FIG. 1) having a partially-recessed portion. For example, the one side edge of the display area DA may have a planar bay, notch or trench shape. Here, the display area has a notch shape on the upper edge of the display area DA in which two protrusion portions protrude toward the outside of the display area DA and the recessed portion is relatively indented toward the inside of the display device DA between the two protrusion portions.

In an embodiment, the display area DA includes a first display area DA1, a second display area DA2 protruding from the first display area DA1 to one side in the first direction dr1, and a third display area DA3 protruding from the first display area DA1 to one side in the first direction dr1. In the drawing, the second display area DA2 is an area disposed at the left upper left end of the first display area DA1, and the third display area DA3 is an area disposed at the right upper right end of the first display area DA1. The second display area DA2 and the third display area DA3 are spaced apart from each other along the second direction dr2.

The two protrusion portions of the edge of the display area DA include the second display area DA2 and the third display area DA3. Further, the recessed portion may be formed on the upper edge of the first display area DA1 between the second display area DA2 and the third display area DA3.

The display area DA includes a plurality of rounded corners corresponding to the shape of the rim of the organic light emitting display device 1. Each rounded corner is disposed between adjacent edges. For example, in the display area DA, rounded corners are disposed at a place where a left edge and an upper edge meet each other, a place where an upper edge and a left edge meet each other, a place where a right edge and a lower edge meet each other, and a place where a lower edge and a left edge meet each other. The rounded corners are disposed adjacent to the corners of the organic light emitting display device 1.

The non-display area NDA is defined as an area where no image is displayed. The non-display area NDA is disposed outside the display area DA. In an embodiment, the non-display area NDA is a ring-shaped area having an outer rim and an inner rim each having a rectangular shape with rounded corners. The inner rim of the non-display area NDA has a shape including portions protruding toward the recessed portion of the display area DA.

A part of the non-display area NDA is provided with a speaker module MD1, a camera module MD2, and a sensor module MD3. In an embodiment, the speaker module MD1, the camera module MD2, and the sensor module MD3 are disposed adjacent to the outer rim of the protrusion portion in the non-display area NDA. As will be described later, various types of wirings bypassing the speaker module MD1, the camera module MD2, and the sensor module MD3 may be arranged adjacent to the protrusion portions of the inner rim in the non-display area NDA. In an embodiment, the sensor module MD3 may include at least one of a luminance sensor, a proximity sensor, an infrared sensor, and an ultrasonic sensor. The arrangement of the speaker module MD1, the camera module MD2, and the sensor module MD3 is not limited thereto.

Referring to FIG. 2, in an embodiment, the organic light emitting display device 1 includes a substrate 10, a circuit layer 20 disposed on the substrate 10, a light emitting element layer 30 disposed on the circuit layer 20, an encapsulation layer 40 disposed on the light emitting element layer 30, a touch layer 50 disposed on the encapsulation layer, and a cover layer 60 disposed on the touch layer 50. However, the present invention is not limited thereto. Each of the layers may have a single-layer or multi-layer structure, and, if necessary, may be provided with an additional layer or a part thereof may be omitted. A laminate structure of the organic light emitting display device 1 will be described later with reference to FIGS. 7, 10, and 12.

The touch layer 50 may include a touch sensing unit 50a that senses a touch input of a user. The arrangement structure of the components constituting the touch layer 50 will be described with reference to FIGS. 3 and 4.

Figure 3:
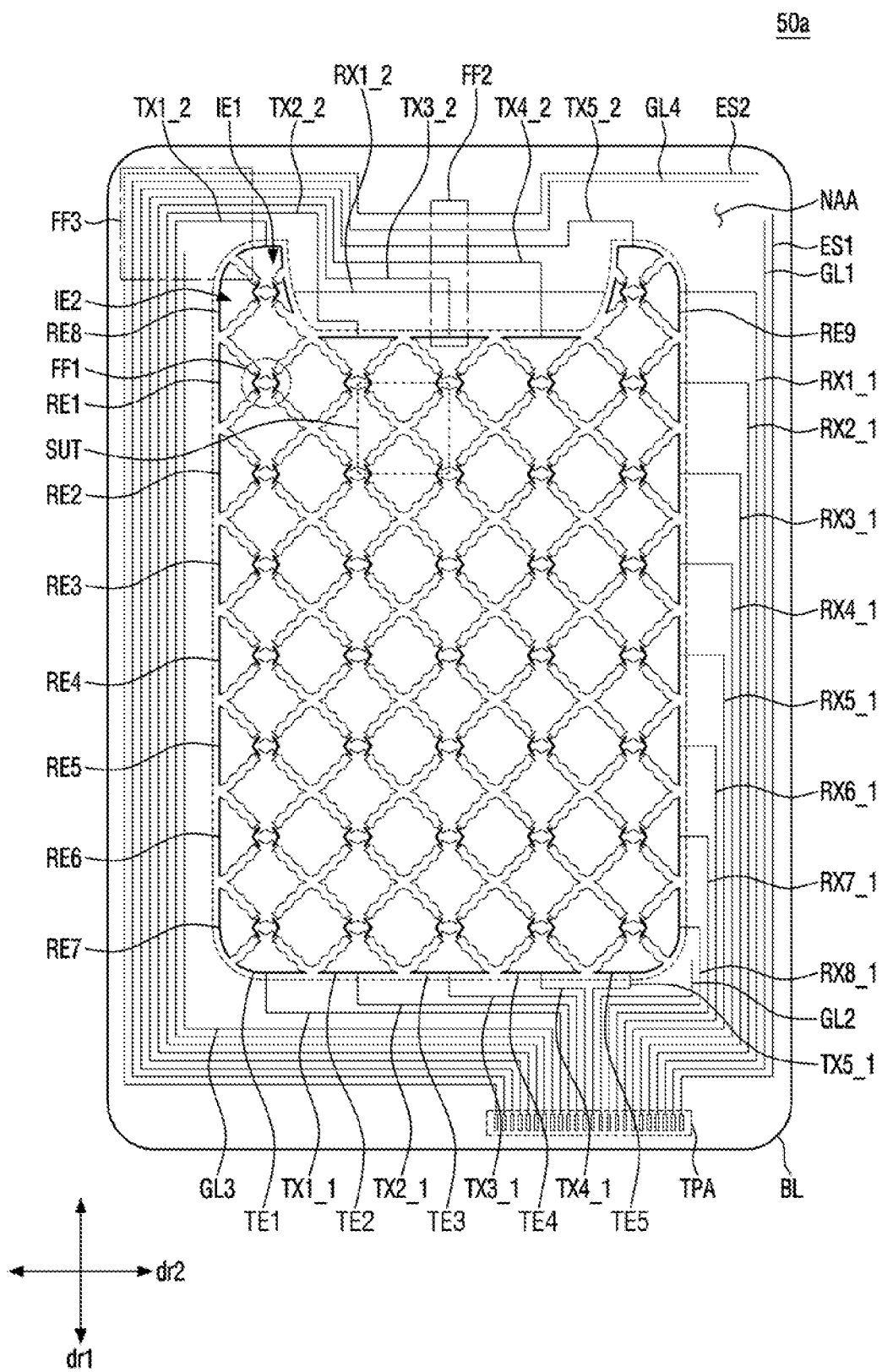
FIG. 3 is a plan view schematically showing a layout structure of a touch sensing unit.
Figure 4:
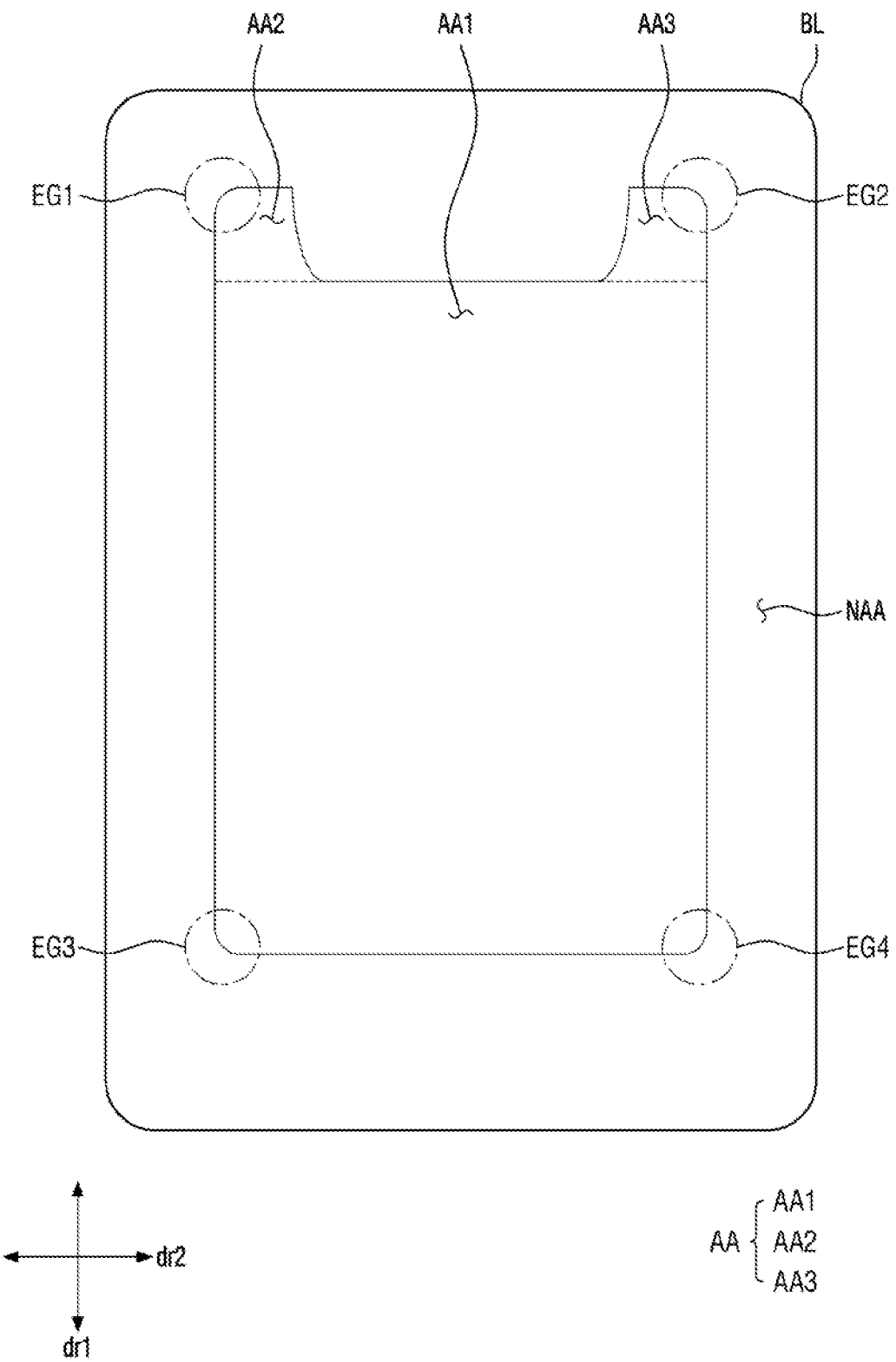
FIG. 4 is a plan view schematically showing each area of a base layer.
Figure 5:
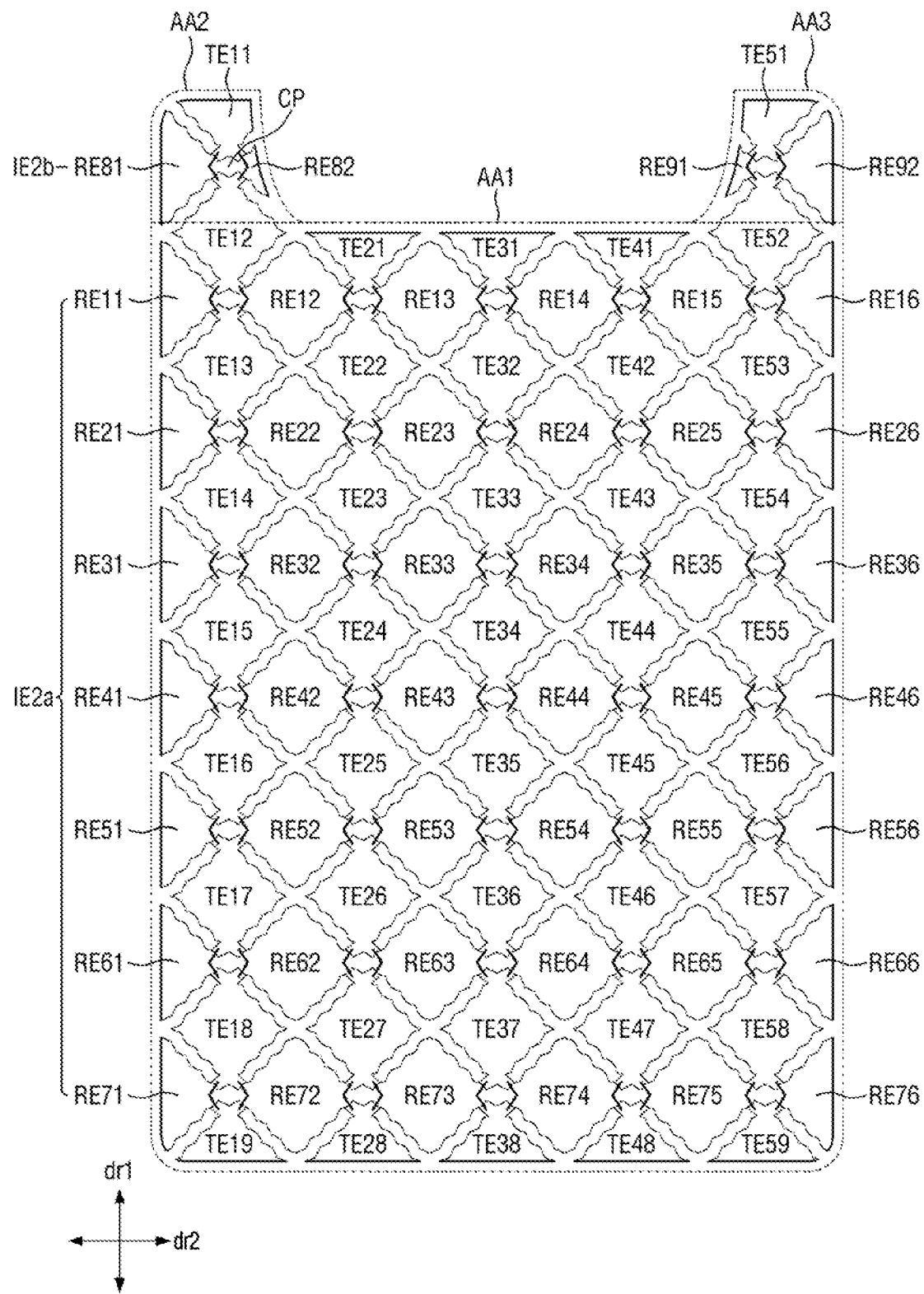
FIG. 5 is an enlarged plan view showing a layout of the sensing electrode unit of FIG. 3.
Figure 6:
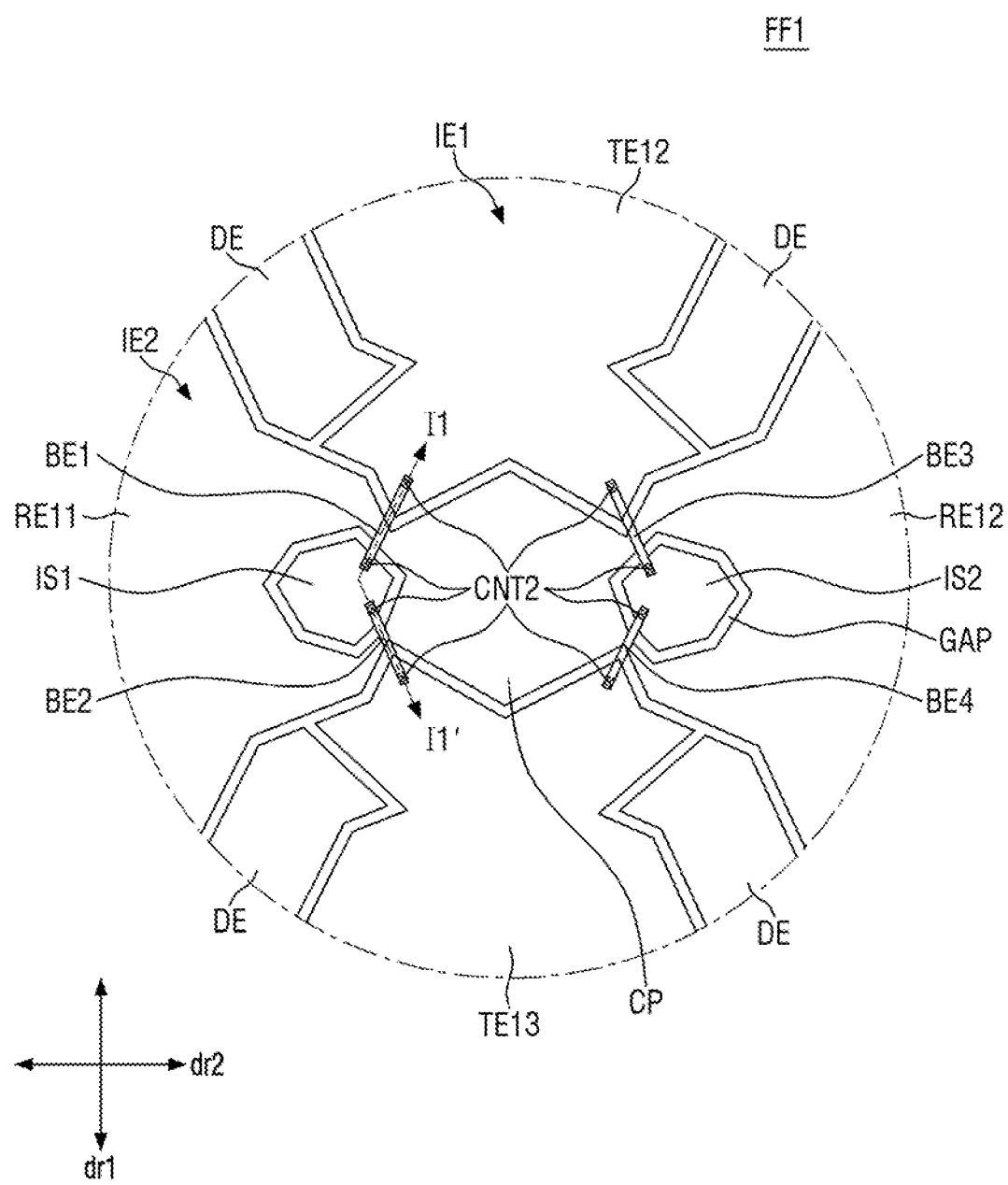
FIG. 6 is an enlarged view of the area FF1 of FIG. 3.
Figure 7:
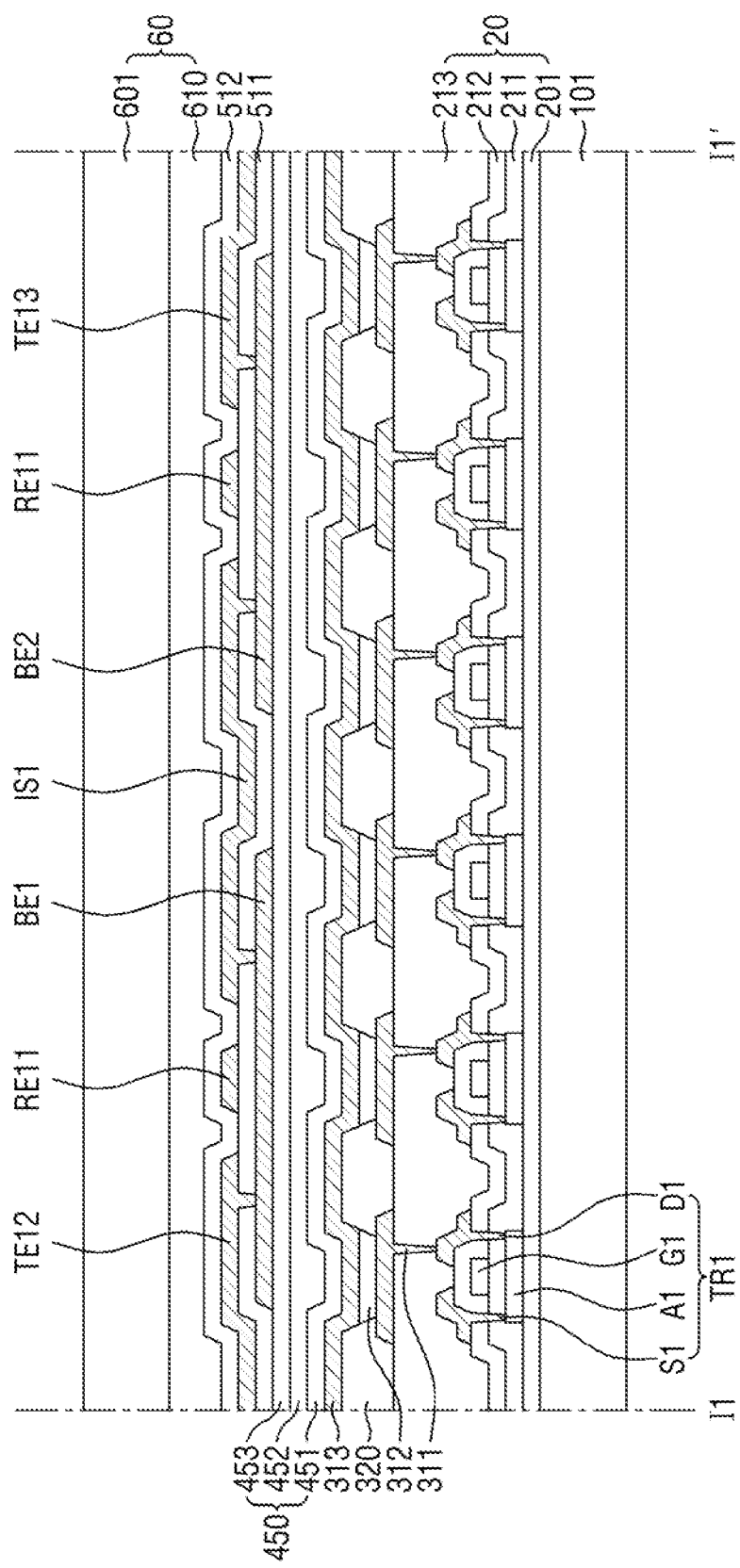
FIG. 7 is a cross-sectional view of an organic light emitting display device taken along the line I1-I1' of FIG. 6.

FIG. 3 is a plan view schematically showing a layout structure of a touch sensing unit. FIG. 4 is a plan view schematically showing each area of a base layer. FIG. 5 is an enlarged plan view showing a layout of the sensing electrode unit of FIG. 3. FIG. 6 is an enlarged view of the area FF1 of FIG. 3. FIG. 7 is a cross-sectional view of an organic light emitting display device taken along the line I1-I1' of FIG. 6.

Referring to FIGS. 3 to 5, the touch sensing unit 50a includes sensing electrode units IE1 and IE2, signal wiring units TX, RX, ES, and GL, and a pad terminal unit TPA. The organic light emitting display device 1 includes a base layer BL on which the touch sensing unit 50a is disposed. One end of each of at least some of the signal wiring units is directly to the sensing electrode units IE1 and IE2, and the other end thereof is directly connected to the pad terminal unit TPA, thereby electrically connecting the sensing electrode units IE1 and IE2 to the pad terminal unit TPA. The signal wiring units TX, RX, ES, and GL are disposed in a non-sensing area NAA surrounding the sensing electrode units IE1 and IE2. For convenience of explanation, the space of the non-sensing area NAA where the signal wiring units are disposed is exaggerated in the drawing.

The base layer BL may be a layer on which the sensing electrode units IE1 and IE2, the signal wiring units TX, RX, ES, and GL, and the pad terminal unit TPA are disposed. In an embodiment, the base layer BL may correspond to the encapsulation layer 40 of FIG. 2. However, the present invention is not limited thereto. In another embodiment, the organic light emitting layer may separately include a touch substrate as the base layer BL, and the touch substrate may be directly disposed on the encapsulation layer 40. The aforementioned touch substrate may be made of glass or plastic such as polyethylene terephthalate (PET), polyimide (PI), polycarbonate (PC), polyethylene (PE), polypropylene (PP), polysulfone (PSF), polymethyl methacrylate (PMMA), triacetyl cellulose (TAC), or a cycloolefin polymer (COP).

The base layer BL may include a plurality of areas. The base layer BL may be provided in substantially the same shape corresponding to the shape of the organic light emitting display device 1. The base layer BL includes a sensing area AA and a non-sensing area NAA surrounding the outside of the sensing area AA. The sensing area AA may include a plurality of areas, and at least two of the areas may have different areas from each other. For example, the sensing area AA includes first to third sensing areas AA1, AA2, and AA3.

The sensing area AA may have substantially the same shape as the display area DA. The sensing area AA has an edge including a portion indented inward at one side of the sensing area AA. The edge may be the upper edge of the sensing area AA in the drawing. The first to third sensing areas AA1, AA2 and AA3 may have the same shape corresponding to the first to third display areas DA1, DA2 and DA3 of the display area DA. That is, the sensing area AA includes a first sensing area AA1. The sensing area AA further includes a second sensing area AA2 and a third sensing area AA3, each protruding from the first sensing area AA1 in the first direction dr1. The second sensing area AA2 and the third sensing area AA3 are spaced apart from each other, and overlap each other along the second direction dr2.

The sensing area AA, like the display area DA, includes a plurality of rounded corners. In an embodiment, the sensing area AA includes a first corner EG1 disposed at place where a left edge and an upper edge meet each other, a second corner EG2 disposed at a place where the upper edge and a right edge meet each other, a third corner EG3 disposed at a place where a lower edge and the left edge meet each other, and a fourth corner EG4 disposed at a place where the right edge and the lower edge meet each other.

Specifically, the third corner EG3 and the fourth corner EG4 are disposed at the left lower side and right lower side of the first sensing area AA1, respectively, the first corner EG1 is disposed at the left upper side of the second sensing area AA2, and the second corner EG2 is disposed at the right upper side of the third sensing area AA3. The left upper side and right lower side corners of the second sensing area AA2 and the right upper side and left lower side corners of the third sensing area AA3 may be rounded corners. The right lower side corner of the second sensing area AA2 may be disposed at a place adjacent to the upper edge of the first sensing area AA1 and at the right edge of the second sensing area AA2. The left lower side corner of the third sensing area AA3 may be disposed at a place adjacent to the upper edge of the first sensing area AA1 and at the left edge of the third sensing area AA3.

When the sensing area AA is formed to have the aforementioned first to fourth corners EG1 to EG4 corresponding to the rounded corners of the organic light emitting display device 1, the dead space of the organic light emitting display device 1 may be reduced. However, the present invention is not limited thereto. Even when the organic light emitting display device 1 has angled rectangular corners, the sensing area AA may be formed to have round corners.

The sensing area AA is defined as an area where the sensing electrode units IE1 and IE2 are formed. The sensing electrode units IE1 and IE2 are disposed inside the sensing area AA.

The non-sensing area NAA may be defined as an area that is not the sensing area AA. For example, the non-sensing area NAA surrounds the first to third sensing areas AA1, AA2, and AA3 with substantially the same shape as the non-display area NDA. The signal wiring units TX, RX, ES, and GL and the pad terminal unit TPA are disposed in the non-sensing area NAA.

The sensing electrode units IE1 and IE2 include a plurality of first touch sensing electrodes IE1 extending in the first direction dr1 and a plurality of second touch sensing electrodes IE2 intersecting at least one of the plurality of first touch sensing electrodes IE1. The plurality of second sensing electrodes IE2 extend in the second direction dr2.

The sensing electrode units IE1 and IE2 may include a sensing electrode and a driving electrode. In this specification, the sensing electrode units IE1 and IE2 or the sensing electrode may be used as a term collectively indicating the sensing electrode and the driving electrode.

In the present embodiment, a case where the first touch sensing electrode IE1 is a driving electrode and the second touch sensing electrode IE2 is a sensing electrode will be described. Although it is illustrated in the drawing that the plurality of first touch sensing electrodes IE1 include first to fifth driving electrodes TE1 to TE5 and the plurality of second touch sensing electrode IE2 include first to ninth sensing electrodes RE1 to RE9, the number of the first touch sensing electrodes IE1 and the number of second touch sensing electrode IE2 are not limited to that exemplified above.

When the organic light emitting display device 1 has a shape in which a length in the first direction dr1 is longer than a length in the second direction dr2, the length of the first touch sensing electrode IE1 in the first direction dr1 is longer than the length of the second touch sensing electrode IE2 in the second direction dr2, but the present invention is not limited thereto.

In an embodiment, the plurality of first touch sensing electrodes IE1 include a first driving electrode TE1 extending from the second sensing area AA2 to the other side of the first direction dr1, a fifth driving electrode TE5 extending from the third sensing area AA3 to the other side of the first direction dr1, and second to fourth driving electrodes TE2 to TE4 extending from the first sensing area AA1 in the first direction dr1 and disposed between the first driving electrode TE1 and the fifth driving electrode TE5. Each of the first driving electrode TE1 and the fifth driving electrode TE5 extends from the second sensing area AA2 and the third sensing area AA3 to the first sensing area AA1.

The first touch sensing electrodes IE1 are spaced apart from each other in the second direction dr2. For example, the first to fifth driving electrodes TE1 to TE5 are sequentially arranged in the second direction dr2. The first driving electrode TE1 and the fifth driving electrode TE5 are disposed adjacent to both side edges of the sensing area AA in the second direction dr2.

The first touch sensing electrode IE1 may include driving electrode having different extending lengths in the first direction dr1. For example, the lengths of the first driving electrode TE1 and the fifth driving electrode TE5, extending from the second sensing area AA2 and the third sensing area AA3 to the first sensing area AA1, in the first sensing area AA1 are longer than the lengths of the second to fourth driving electrodes TE2 to TE4, extending only from the first sensing area AA1, in the first direction dr1.

Each driving electrode may include at least one driving electrode pattern. For example, the first driving electrode TE1 and the fifth driving electrode TE5 include first to ninth driving electrode patterns TE11 to TE19 and TE51 to TE59 sequentially spaced apart from each other along the first direction dr1. The second, third and fourth driving electrodes TE2, TE3 and TE4 include first to eighth driving electrode patterns TE21 to TE28, TE31 to TE38, and TE41 to TE48 sequentially spaced apart from each other along the first direction dr1.

The first driving electrode pattern TE11 of the first driving electrode TE1 and the first driving electrode pattern TE51 of the fifth driving electrode TE5 may be disposed in the second sensing area AA2 and the third sensing area AA3 without overlapping the second to fourth driving electrodes TE2 to TE4 in the second direction dr2. The second to ninth driving electrode patterns TE12 to TE19 and TE52 to TE59 may overlap the first to eighth driving electrode patterns TE21 to TE28, TE31 to TE33, and TE41 to TE46 of the second to fourth driving electrode TE2 to TE4 in the second direction dr2. In an embodiment, the second driving electrode pattern TE12 of the first driving electrode TE1 is disposed in the sensing area AA2 and the first sensing area AA1 and at the boundary between the sensing area AA2 and the first sensing area AA1. In an embodiment, the second driving electrode pattern TE52 of the fifth driving electrode TE5 is disposed in the third sensing area AA3 and the first sensing area AA1 and at the boundary between the third sensing area AA3 and the first sensing area AA1. The first driving electrode TE1 and the fifth driving electrode TE5 include an area overlapping the second to fourth driving electrodes TE2 to TE4 in the second direction dr2 and an area non-overlapping the second driving electrode TE2 to TE4 in the second direction dr2. Further, the first driving electrode TE1 and the fifth driving electrode TE5 overlap each other in the second direction dr2 in the area non-overlapping the second to fourth driving electrodes TE2 to TE4.

The plurality of second touch sensing electrodes IE2 include a first sub-touch sensing electrode unit IE2a continuously extending from one side edge of the first sensing area AA1 to the other side edge thereof in the second direction dr2 and a second sub-touch sensing electrode unit IE2b disposed in the second sensing area AA2 and the third sensing area AA3 and extending in the second dr2. The first sub-touch sensing electrode unit IE2a and the second sub-touch sensing electrode unit IE2b may include at least one sensing electrode. For example, the first sub-touch sensing electrode unit IE2a includes first to seventh sensing electrodes RE1 to RE7, and the second sub-touch sensing electrode unit IE2b includes eighth and ninth sensing electrodes RE8 and RE9.

The first to seventh sensing electrodes RE1 to RE7 of the first sub-touch sensing electrode unit IE2a are spaced apart from each other in the first direction dr1. For example, the first to seventh sensing electrodes RE1 to RE7 are sequentially arranged in the first direction dr1.

The second sub-touch sensing electrode unit IE2b is adjacent to and spaced apart from the first sub-touch sensing electrode unit IE2a in the first direction dr1. In an embodiment, the eighth sensing electrode RE8 and the ninth sensing electrode RE9 are disposed adjacent to and spaced apart from the first sensing electrode RE1 in the first direction dr1.

In an embodiment, the plurality of first to seventh sensing electrodes RE1 to RE7 have the same extending length in the second direction dr2. Meanwhile, the lengths of the first sub-touch sensing electrode unit IE2a and the second sub-touch sensing electrode unit IE2b in the second direction dr2 are different from each other. For example, the length of the first sub-touch sensing electrode unit IE2a in the second direction dr2 is longer than the length of the second sub-touch sensing electrode unit IE2b in the second direction dr2.

The second sub-touch sensing electrode unit IE2b may have the same shape as a part of the middle portion of the first sensing electrode RE1 cut off. For example, the second sub-touch sensing electrode unit IE2b has a shape having only a portion including one end of the first sensing electrode RE1 and a portion including the other end thereof.

The second sub-touch sensing electrode unit IE2b includes an eighth sensing electrode RE8 disposed in the second sensing area AA2 and a ninth sensing electrode RE9 disposed in the third sensing area AA3. The eighth sensing electrode RE5 and the ninth sensing electrode RE9 are disposed on the same virtual straight line extending in the second direction dr2. For example, the eighth sensing electrode RE8 and the ninth sensing electrode RE9 are spaced apart from each other in the second direction dr2 and overlap each other in the second direction dr2.

Each of the sensing electrodes RE to RE9 may include at least one sensing electrode pattern. For example, the first to seventh sensing electrodes RE1 to RE7 include first to sixth sensing electrode patterns RE11 to RE16, RE21 to RE26, RE31 to RE36, RE41 to RE46, RE51 to RE56, RE61 to RE66, and RE71 to RE76, which are sequentially arranged to be spaced apart from each other. The eighth sensing electrode RE8 and the ninth sensing electrode RE9 include first sensing electrode patterns RE81 and RE91 and second sensing electrode patterns RE82 and RE92, which are arranged in the second direction dr2. The areas of the first sensing electrode pattern RE81 and the second sensing electrode pattern RE82 of the eighth sensing electrode RE8 may be different from each other. For example, the area of the first sensing electrode pattern RE81 of the eighth sensing electrode RE8 is larger than the area of the second sensing electrode pattern RE82 thereof. Similarly, the areas of the first sensing electrode pattern RE91 and the second sensing electrode pattern RE92 of the ninth sensing electrode RE9 may be different from each other. For example, the area of the second sensing electrode pattern RE92 of the ninth sensing electrode RE9 is larger than the area of the first sensing electrode pattern RE91 thereof.

Meanwhile, the sensing electrode patterns adjacent to each other in each of the sensing electrodes RE1 to RE9 in the second direction dr2 may be physically connected to each other. For example, a connection portion CP connecting the sensing electrode patterns adjacent to each other in the second direction dr2 is disposed between the driving electrode patterns adjacent to each other in the first direction dr1 of the first touch sensing electrode IE1. For example, the first sensing electrode pattern RE11 and second sensing electrode pattern RE12 of the first sensing electrode RE1 are physically connected to each other through the connection portion CP, whereas the second driving electrode pattern TE12 and third driving electrode pattern TE13 of the first driving electrode TE1 are physically separated from each other by the connection portion CP.

The first sensing electrode pattern RE81 and second sensing electrode pattern RE82 of the eighth sensing electrode RE8 may be physically connected to each other using the connection portion CP disposed between the first driving electrode pattern TE11 and second driving electrode pattern TE12 of the first driving electrode TE1. The first driving electrode pattern TE11 and the second driving electrode pattern TE12 may be physically separated from each other by the connection portion CP. Similarly, the first sensing electrode pattern RE91 and second sensing electrode pattern RE92 of the ninth sensing electrode RE9 may be physically connected to each other using the connection portion CP disposed between the first driving electrode pattern TE51 and second driving electrode pattern TE52 of the fifth driving electrode TE5. The first driving electrode pattern TE51 and the second driving electrode pattern TE52 may be physically separated from each other by the connection portion CP. In this case, the second sensing electrode pattern RE82 of the eight sensing pattern RE8 and the first sensing electrode pattern RE91 of the ninth sensing electrode RE9 are disposed between the first driving electrode TE1 and the fifth driving electrode TE5.

The eighth sensing electrode RE8 traverses only the first driving electrode TE1 without traversing the second to fifth driving electrodes TE2 to TE5. The ninth sensing electrode RE9 traverses only the fifth driving electrode TE5 without traversing the first to fourth driving electrodes TE1 to TE4. The first to seventh sensing electrodes RE to RE7 traverse all the driving electrodes TE1 to TE5.

In an embodiment, each of the sensing electrode patterns disposed at one end and the other end of the first touch sensing electrode IE1 and the second touch sensing electrode IE2 may have an approximately rhombus shape. Each of the sensing electrode patterns disposed at one end and the other end of the first touch sensing electrode IE1 and the second touch sensing electrode IE2 may have an isosceles triangle shape in which the rhombus shape is cut in half. Each of the driving electrode patterns TE11 to TE59 and each of the sensing electrode patterns RE11 to RE92 may include at least one zigzag-shaped side. For example, each of the sides of the rhombic driving electrode pattern (for example, TE12) and the rhombic sensing electrode pattern (for example, RE12) may have a zigzag shape. Further, two isosceles of an isosceles triangular driving electrode pattern (for example, TE11) and an isosceles triangular sensing electrode pattern (for example, RE11) may have a zigzag shape, and the other one may have a linear shape. When each of the driving electrode patterns TE11 to TE59 and each of the sensing electrode patterns RE11 to RE92 include zigzag-shaped sides, it is possible to prevent a moire pattern from being viewed to a user, and it is possible to prevent the display failure of the organic light emitting display device 1 due to a moire pattern.

Since the sensing area AA includes rounded corners EG1 to EG4, each of the sensing electrode units IE1 and IE2 adjacent to the rounded corners EG1 to EG4 of the sensing area AA may have shapes cut according to the shapes of the rounded corners EG1 to EG4 of the sensing area AA. For example, the first driving electrode pattern TE11 and ninth driving electrode pattern TE19 of the first driving electrode TE1, the first driving electrode pattern TE15 and ninth driving electrode pattern TE59 of the fifth driving electrode TE5, the first sensing electrode pattern RE71 and sixth sensing electrode pattern RE76 of the seventh sensing electrode RE7, the first sensing electrode pattern RE81 and second sensing electrode pattern RE82 of the eighth sensing electrode RE8 have shapes cut according to the shapes of the rounded corners EG1 to EG4 of the sensing area AA. The position and area where the sensing electrode units IE11 and IE12 are cut off may be determined by the radius of curvature of the rounded corners EG1 to EG4 of the sensing area AA.

Additionally, referring to FIGS. 6 and 7, the sensing area AA further includes island electrodes IS1 and IS2 disposed inside the second touch sensing electrode IE2 and insulated and spaced from the second touch sensing electrode IE2. The driving electrode patterns adjacent to each other of the first touch sensing electrode IE1 may be electrically connected to each other through the island electrodes IS1 and IS2. For convenience of explanation, in the drawing, a portion where the first sensing electrode RE1 intersects the first driving electrode TE1 will be described as an example, but it will be understood that the same configuration is disposed at a place where each of the driving electrodes TE1 to TE5 intersects each of the sensing electrodes RE1 to RE7.

In an embodiment, the first island electrode IS1 and the second island electrode IS2 disposed between the first sensing electrode pattern RE11 and second sensing electrode pattern RE12 of the first sensing electrode RE1 are disposed in the sensing area AA. The first island electrode IS1 is disposed between the first sensing electrode pattern RE11 and the connection CP in the first sensing electrode RE1. The second island electrode IS2 is disposed between the second sensing electrode pattern RE12 and the connection CP in the first sensing electrode RE1.

The second driving electrode pattern TE12 and first island electrode IS1 of the first driving electrode TE1 may be electrically connected to each other through a first bridge wiring BE1, and the third driving electrode pattern TE13 and first island electrode IS1 of the first driving electrode TE1 may be electrically connected to each other through a second bridge wiring BE2. Further, the second driving electrode pattern TE12 and second island electrode IS2 of the first driving electrode TE1 may be electrically connected to each other through a third bridge wiring BE3, and the third driving electrode pattern TE13 and second island electrode IS2 of the first driving electrode TE1 may be electrically connected to each other through a fourth bridge wiring BE4. The second driving electrode pattern TE12 and third driving electrode pattern TE13 of the first driving electrode TE1 may be electrically connected to each other through the first island electrode IS1, the second island electrode IS2, and the first to fourth bridge wirings BE1 to BE4.

As described above, the two island electrodes IS1 and IS2 are disposed between the second driving electrode pattern TE12 and third driving electrode pattern TE13 of the first driving electrode TE1 in the first direction dr1. Even when any one of the first to fourth bridge wirings BE1 to BE4 is disconnected, the second driving electrode pattern TE12 and third driving electrode pattern TE13 of the first driving electrode TE1 may still be electrically connected to each other The island electrodes IS1 and IS2, as shown in the drawings, have a diamond shape, but the shape thereof is not limited thereto. The island electrodes IS1 and IS2 may have various shapes such as a square or another polygon, a circle, and an ellipse.

When the driving electrode patterns of the first sensing electrode IE1 are connected through the island electrodes IS1 and IS2, the margin of the bridge wirings may be reduced, compared to when the driving electrode patterns of the first sensing electrode IE1 are connected through one bridge wiring without going through the island electrodes. That is, the lengths of the bridge wirings BE1 to BE4 may be reduced. As a result, transmittance may be improved by reducing overlap between the bridge wirings BE1 to BE4 and the display area DA. Further, since the contact area between the first sensing electrode IE1 and the bridge wirings BE1 to BE4 is increased, the contact resistance therebetween may be improved.

The lamination relationship of the island electrodes IS1 and IS2, the bridge wirings BE1 to BE4, the driving electrode patterns, the sensing electrode patterns, and other components of the organic light emitting display device will be described later.

Next, a relationship between the unit sensing area and the sensing electrode unit will be described with reference to FIG. 8.

Figure 8:
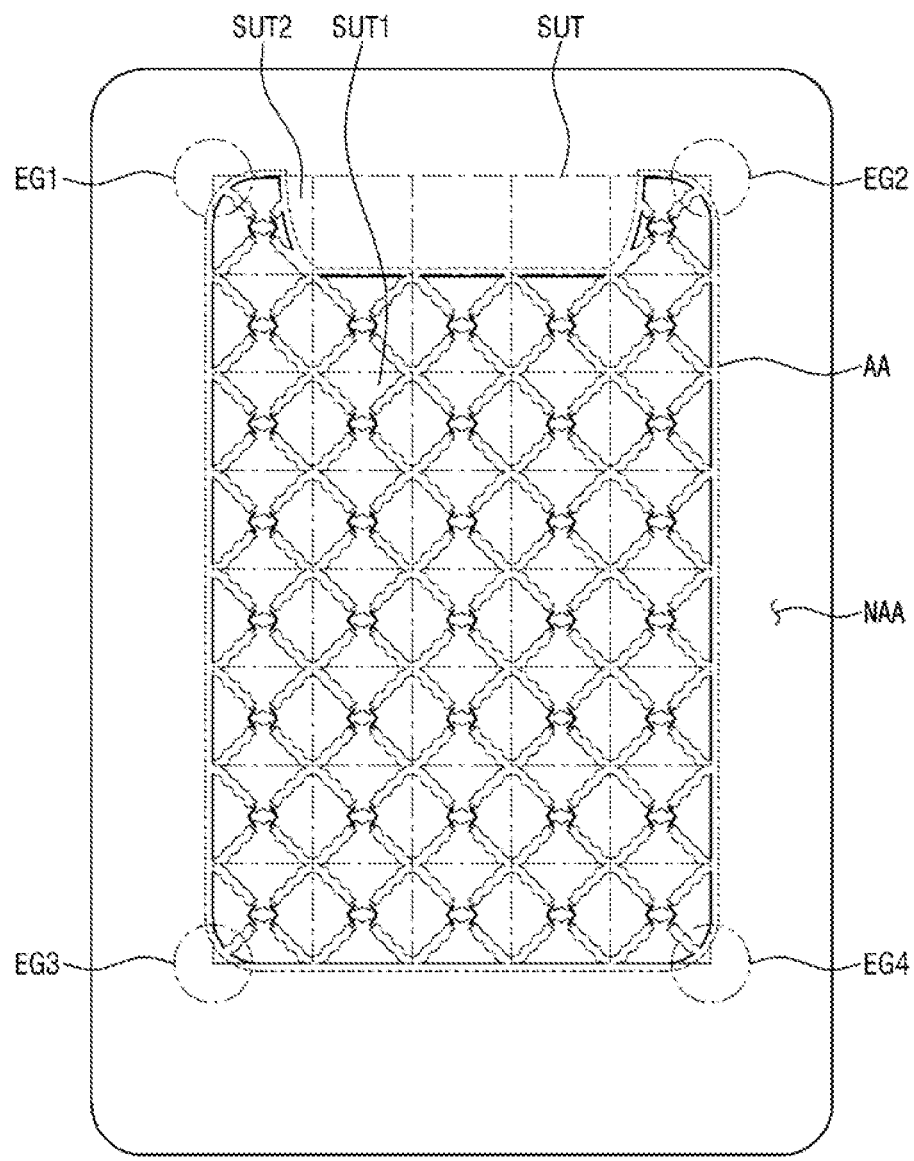
FIG. 8 is a plan view of the sensing electrode unit of FIG. 3 divided into unit sensing areas.
Figure 8:
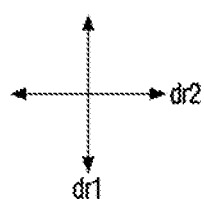

FIG. 8 is a plan view of the sensing electrode unit of FIG. 3 divided into unit sensing areas.

Referring to FIGS. 3 and 8, the driving electrode patterns TE11 to TE59 of the driving electrodes TE1 to TE5 and the sensing electrode patterns of the sensing electrodes RE1 to RE9, adjacent to each other, may constitute unit sensing areas. For example, based on an area where the driving electrodes TE1 to TE5 and the sensing electrodes RE1 to RE9 intersect each other, one of the two driving electrode patterns (for example, TE22 and TE32) adjacent to each other in the second direction dr2 and one of the two sensing electrode patterns (for example, RE13 and RE23) adjacent to each other in the first direction dr1 may constitute one square or rectangle. As such, the area defined by the half of the adjacent driving electrode patterns and sensing electrode patterns may be one unit sensing area SUT. In the unit sensing area SUT, the capacitance values between the adjacent driving electrode patterns and sensing electrode patterns are measured, thereby determining whether or not a touch input is applied and calculating the corresponding position as touch input coordinates. The touch sensing may be performed by a mutual capping method, but is not limited thereto.

Each unit sensing area SUT may be larger than a pixel in size. For example, the unit sensing area SUT may correspond to a plurality of pixels. The length of one side of the unit sensing area SUT may be in a range of 4 mm to 5 mm, but is not limited thereto.

Meanwhile, the plurality of unit sensing areas SUT are arranged in row and column directions. Here, the row and column directions may refer to the second direction dr2 and the first direction dr1, respectively. For example, as shown in the drawing, the plurality of unit sensing areas SUT may be in the form of a matrix of eight rows and five columns. However, some of the plurality of unit sensing areas SUT may include areas where the sensing electrode units IE1 and IE2 are not provided. For example, the areas of first row and second column, first row and third column and first row and fourth column may be areas where the sensing electrode units IE1 and IE2 are not disposed substantially due to the atypical edge of the sensing area AA. Therefore, the arrangement form of the plurality of unit sensing areas SUT may be one in which first row and second column, first row and third column and first row and fourth column of the matrix of eight rows and five columns are omitted.

The ratio of the area occupied by the sensing electrode units IE1 and IE2 in each unit sensing area SUT may not be the same. In particular, since the sensing area AA includes atypical edges and rounded corners, the ratio of the area occupied by the sensing electrode units IE1 and IE2 in the unit sensing area SUT including atypical edges and the unit sensing area SUT including rounded corners may be small as compared with in the unit sensing area SUT not including atypical edges and rounded corners.

If the ratio (hereinafter, referred to as an area ratio) of the area occupied by the sensing electrode units IE1 and IE2 in the unit sensing area SUT is defined as 1 in the unit sensing area SUT where the sensing electrode units IE1 and IE2 are not cut off (for example, the unit sensing area SUT of second row and second column), in an embodiment, the area ratio of the unit sensing area SUT where the sensing electrode units IE1 and IE2 are not cut off (for example, the unit sensing area SUT of first row and first column, including the corner EG1) may be 0.6 to 0.8, but is not limited thereto. In another embodiment, the area ratio of the unit sensing area SUT where the sensing electrode units IE1 and IE2 are not cut off may have various values of less than 1.

As the ratio of the area occupied by the sensing electrode units IE1 and IE2 in each unit sensing area SUT increases, touch sensitivity and touch performance may be improved. For example, the touch sensitivity in the unit sensing area SUT having an area ratio of 1 may be higher than the touch sensitivity in the unit sensing area SUT having an area ratio of 0.6.

For convenience of explanation, the unit sensing area SUT having an area ratio of 1 will be referred to as a first unit sensing area SUT1, and the unit sensing area SUT having an area ratio of less than 1 will be referred to as a second unit sensing area SUT2. For example, the second unit sensing area SUT2 may include unit sensing areas (unit sensing areas of first row and first column, first row and fifth column, eighth row and first column, and eighth row and fifth column). The first unit sensing area SUT1 may include, for example, a unit sensing unit SUT of third row and second column).

The second unit sensing area SUT2 may require a compensation design to increase the touch sensitivity by the first unit sensing area SUT. First, a connection relationship between the signal wiring units TX, RX, ES, and GL and the sensing electrode units IE1 and IE2 will be described.

Figure 9:
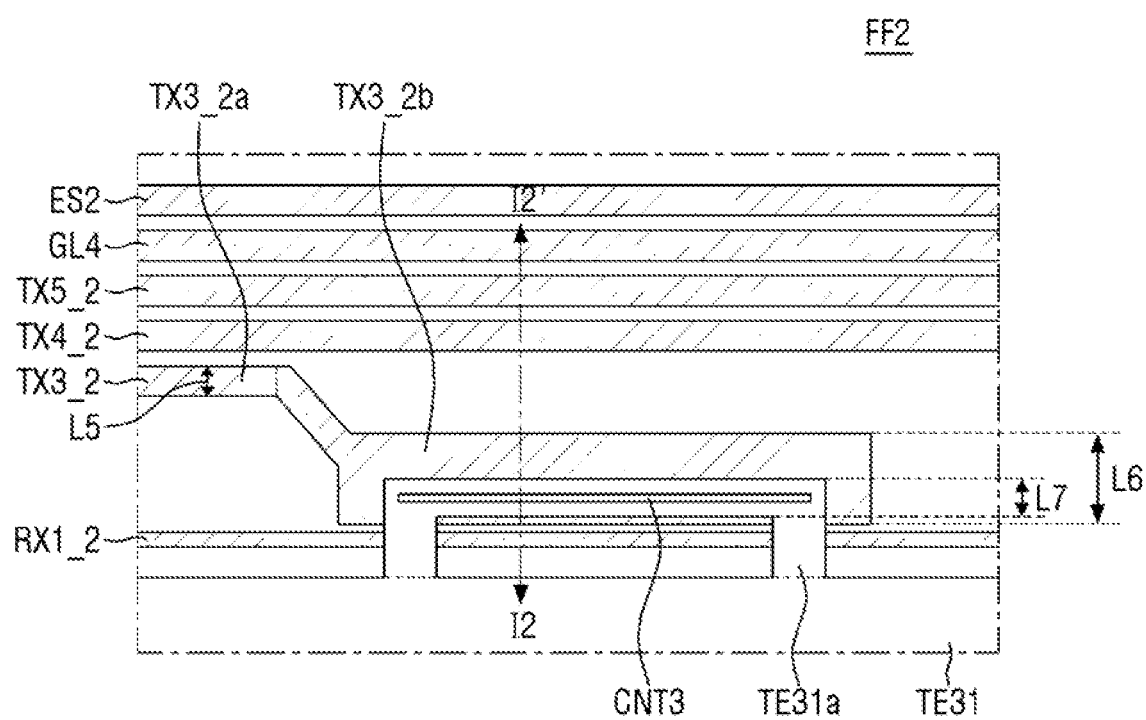
FIG. 9 is an enlarged view of the area FF2 of FIG. 3.
Figure 10:
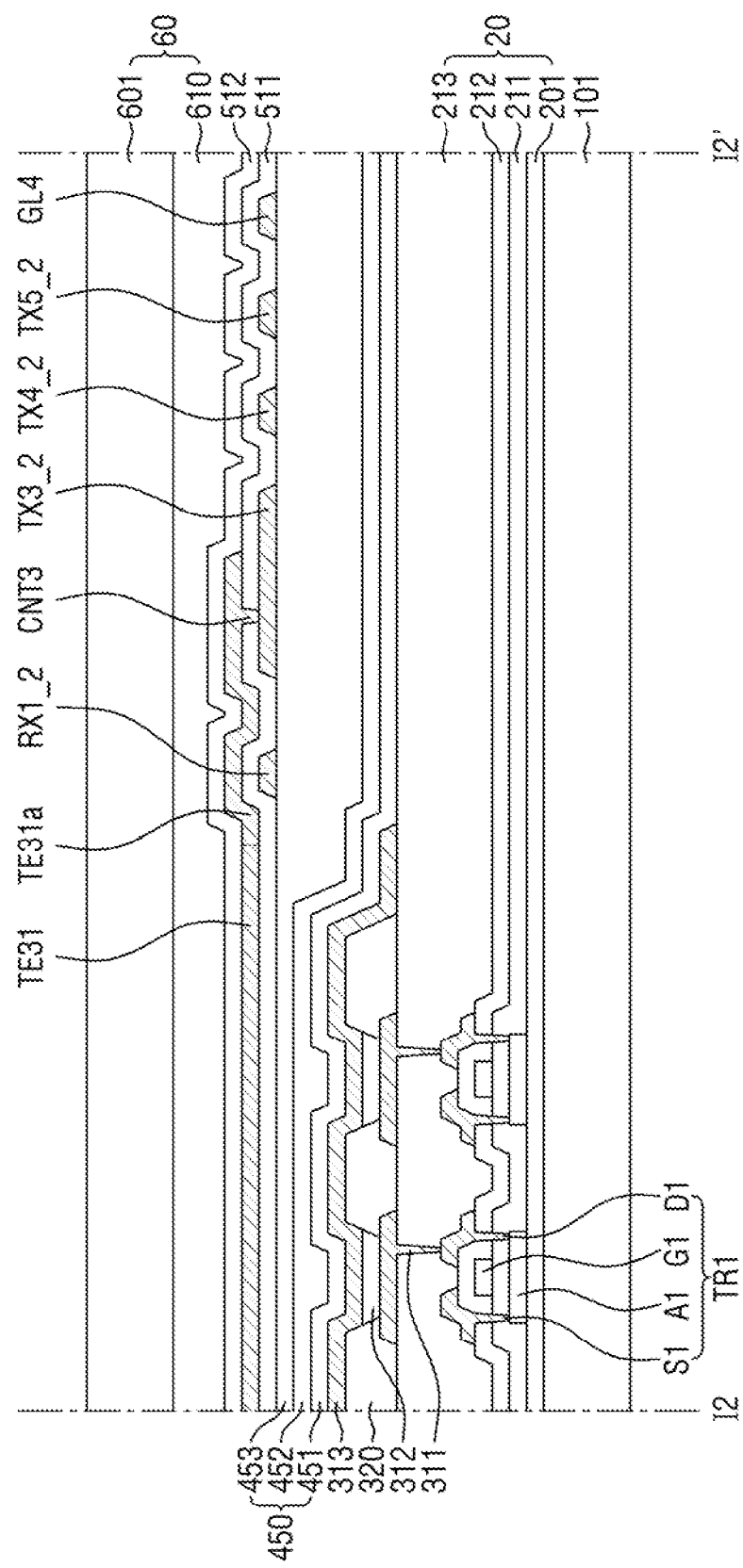
FIG. 10 is a cross-sectional view of a part of an organic light emitting display device taken along the line I2-I2' of FIG. 9.

FIG. 9 is an enlarged view of the area FF2 of FIG. 3. FIG. 10 is a cross-sectional view of a part of an organic light emitting display device taken along the line I2-I2' of FIG. 9.

Referring to FIGS. 9 and 10 together with FIG. 3, driving signals may be transmitted to the driving electrodes TE1 to TE5 through the touch driving wirings TX1_1 to TX5_1 and TX1_2 to TX5_2, and sensing signals may be transmitted to the sensing electrodes RE1 to RE9 through the touch sensing wirings RX1_1 to RX8_1.

The touch driving wirings TX1_1 to TX5_1 and TX1_2 to TX5_2 are connected to each of the driving electrodes TE1 to TE5. In an embodiment, the plurality of touch driving wirings TX1_1 to TX5_1 and TX1_2 to TX5_2 may be connected to each of the driving electrode TE1 to TE5. That is, each of the driving electrodes TE1 to TE5 may be double-routed. For example, the touch driving wirings TX1_1 to TX5_1 and TX1_2 to TX5_2 include first touch driving wirings TX1_1 to TX5_1 connected to the lower end of each of the driving electrodes TE1 to TE5 and second touch driving wirings TX1_2 to TX5_2 connected to the upper end of each of the driving electrodes TE1 to TE5.

In an exemplary embodiment, the second touch driving wrings TX1_2 to TX5_2 may be mainly disposed on one side of the non-sensing area NAA in the second direction, and the touch sensing wrings RX1_1 to RX8_1 may be mainly disposed on one side of the non-sensing area NAA in the second direction.

The first touch driving wirings TX1_1 to TX5_1 extend from the pad terminal unit TPA to one side and/or the other side in the second direction dr2 and are connected to the lower ends of the driving electrodes TE1 to TE5.

The second touch driving wirings TX1_2 to TX5_2 extend from the pad terminal unit TPA to one side in the second direction dr2, bypass the left edge of the display area DA, and bypass the upper edge of the display area DA including protrusion portions to be connected to the upper end of each of the driving electrodes TE1 to TE5.

In an embodiment, when at least some of the second touch driving wirings TX1_2 to TX5_2 bypass the upper edge of the sensing area AA, they bypass an area where the speaker module MD1, the camera module MD2, and the sensor module MD3 are disposed in the second sensing area AA2, the third sensing area AA3, and the non-display area NDA. For example, when the second touch driving wirings TX1_2 to TX5_2 connected to the first to fifth driving electrodes TE1 to TE5 bypass the upper edge of the sensing area AA, they extend approximately in the second direction dr2 with portions extending in the first direction dr1 to bypass an area where the speaker module MD1, the camera module MD2, and the sensor module MD3 are disposed.

The second to fourth wirings TX2_2 to TX4_2 of the second touch driving wirings TX1_2 to TX5_2 connected to the second to fourth driving electrodes TE2 to TE4 include a portion disposed between the eighth sensing electrode RE8 and the ninth sensing electrode RE9. The second to fourth wirings TX2_2 to TX4_2 of the second touch driving wirings TX1_2 to TX5_2 connected to the second to fourth driving electrodes TE2 to TE4 include a portion overlapping the eighth sensing electrode RE8 and the ninth sensing electrode RE9 in the second direction dr2.

The touch sensing wirings RX1_1 to RX8_1 are connected to the respective sensing electrodes RE1 to RE9. In an embodiment, unlike the driving electrodes TE1 to TE5, each of the first to seventh sensing electrodes RE1 to RE7 and the ninth sensing electrode RE9 is connected to the touch sensing wiring RX1_1 to RX8_1 at only one end thereof, but the present invention is not limited thereto.

In an embodiment, each of the touch sensing wirings RX1_1 to RX8_1 connected to the first to seventh sensing electrodes RE1 to RE7 and the ninth sensing electrode RE9 extends from the pad terminal unit TPA to the lower side of the non-sensing area NAA in the first direction dr1 and then turns to the other side thereof in the second direction dr2, and further extends from the outside of the right edge of the sensing area AA in the first direction dr1 to the right ends (for example, RE16, RE26, RE36, RE46, RE56, RE76, and RE92) of the first to seventh sensing electrodes RE1 to RE7 and the ninth sensing electrode RE9 for connections between the touch sensing wirings RX1_1 to RX8_1 to the sensing electrodes RE1 to RE7 and RE9. For example, in the first to seventh sensing electrodes RE1 to RE7, the touch sensing wirings RX2_1 to RX8_1 are connected only to the ends of the respective sixth sensing electrode patterns RE16, RE26, RE36, RE46, RE56 and RE76. Further, in the ninth sensing electrode RE9, the touch sensing wiring RX1_1 is connected only to the end of the second sensing electrode pattern RE92 of the ninth sensing electrode RE9.

Meanwhile, a connection wiring RX1_2 for connecting the eighth sensing electrode RE8 and the ninth sensing electrode RE9 is provided between the eighth sensing electrode RE8 and the ninth sensing electrode RE9. Thus, the connection wiring RX1_2 traverses some of the second touch driving wirings TX1_2 to TX5_2. For example, the connection wiring RX1_2 traverses the second to fourth wirings TX2_2 to TX4_2 of the second touch driving wirings TX1_2 to TX5_2. In this case, to prevent a short circuit between the second to fourth wirings TX2_2 to TX4_2 of the second touch driving wirings TX1_2 to TX5_2 and the connection wiring RX1_2, the second to fourth driving electrodes TE2 to TE4 and the second to fourth wirings TX2_2 to TX4_2 of the second touch driving wirings TX1_2 to TX5_2 are connected to each other through a driving bridge electrode portion (for example, TE31a) extending from the second to fourth driving electrodes TE2 to TE4.

The connection wiring RX1_2 traverses the driving bridge electrode portion TE31a and extends in the second direction dr2 from the eighth sensing electrode RE8 to the ninth sensing electrode RE9. An insulating material (for example, a first touch insulating layer 511 in FIG. 10) is disposed between the driving bridge electrode portion TE31a and the connection wiring RX1_2.

In an embodiment, the eighth sensing electrode RE8 need not be directly connected to the touch sensing wirings RX1_1 to RX8_1 connected to the pad terminal unit TPA. The eighth sensing electrode RE8 and the ninth sensing electrode RE9 are electrically connected to each other through the connection wiring RX1_2, and the touch sensing wiring RX8_1 connected to the ninth sensing electrode RE9 is connected to the pad terminal unit TPA, so that the eighth sensing electrode RE8 and the ninth sensing electrode RE9 may receive the same sensing signal.

Meanwhile, the driving voltage signal provided to each of the driving electrodes TE1 to TE5 may be a driving voltage signal having a voltage level higher than a sensing voltage signal provided to each of the sensing electrodes RE1 to RE9. When a signal of a relatively high voltage level is provided to each of the driving electrodes TE1 to TE5, the voltage level in the touch sensing electrode may vary greatly for each position depending on the distance between the driving electrode and the wiring. For example, when one of the touch driving wirings TX1_1 to TX5_1 is connected only to one end of each of the driving electrodes TE1 to TE5, the voltage level at the first driving electrode pattern (for example, TE11 or TE21) and the voltage level at the eighth or ninth driving electrode pattern (for example, TE19 or TE28) may be greatly different from each other. The plurality of touch driving wirings TX1_1 to TX5_1 and TX1_2 to TX5_2 are connected to each of the driving electrodes TE1 to TE5, so that the difference between the voltage levels of the driving electrode patterns of the respective driving electrodes TE1 to TE5 may be minimized.

Antistatic wirings ES1 and ES2 are disposed at the outermost portions of the touch driving wirings TX1_1 to TX5_1 and TX1_2 to TX5_2 and the touch sensing wirings RX1_1 to RX8_1 arranged to surround the sensing electrode units IE1 and IE2. In an embodiment, the antistatic wirings ES1 and ES2 include a first antistatic wiring ES1 and a second antistatic wiring ES2. The first and second antistatic wirings ES1 and ES2 surround the display area DA, the touch driving wirings TX1_1 to TX5_1 and TX1_2 to TX5_2 and the touch sensing wirings RX1_1 to RX8_1 in a ring shape. The first antistatic wiring ES1 and the second antistatic wiring ES2 need not be connected to each other.

The first antistatic wiring ES1 surrounds the touch sensing wirings RX1_1 to RX8_1 located on the right and lower sides of the display area DA.

The second antistatic wiring ES2 may cover the touch driving wirings TX1_1 to TX5_1 and TX1_2 to TX5_2 located on the left, upper and lower sides of the display area DA.

Each of the antistatic wirings ES1 and ES2 may be a wiring to which a first reference voltage applies. Each of the antistatic wirings ES1 and ES2 may serve to alleviate an electrostatic shock that may apply to the touch driving wirings TX1_1 to TX5_1 and TX1_2 to TX5_2, the touch sensing wirings RX1_1 to RX8_1 and the sensing electrode units IE1 and IE2.

Guard wirings GL1 to GL4 are disposed between the touch driving wirings TX1_1 to TX5_1 and TX1_2 to TX5_2 and the touch sensing wirings RX1_1 to RX8_1 and/or between the touch driving wirings TX1_1 to TX5_1 and TX1_2 to TX5_2 and the touch sensing wirings RX1_1 to RX8_1 and the respective antistatic wirings ES1 and ES2. The guard wirings GL1 to GL4 include a first guard wiring GL1, a second guard wiring GL2, a third guard wiring GL3, and a fourth guard wiring GL4.

The first guard wiring GL1 is disposed between the touch sensing wiring lines RX1_1 to RX8_1 extending to the right side of the non-sensing area NAA and the first antistatic wiring ES1.

The second guard wiring GL2 is disposed between the first touch driving wirings TX1_1 to TX5_1 connected to the lower end of the first touch sensing electrode IE1 and the touch sensing wirings RX1_1 to RX8_1 extending to the right side of the non-sensing area NAA.

The third guard wiring GL3 is disposed between the first touch driving wirings TX1_1 to TX5_1 and the second touch driving wirings TX1_2 to TX5_2 on the lower side of the non-sensing area NAA, and is disposed between the second touch driving wirings TX1_2 to TX5_2 and the sensing electrode units IE1 and IE2 on the left side of the non-sensing area NAA. For example, the third guard wiring GL3 is disposed between a first wiring portion (TX1_2a in FIG. 11) of the first wiring TX1_2 of the second touch driving wirings TX1_2 to TX5_2 and the sensing electrode units IE1 and IE2 on the left side of the non-sensing area NAA. The first wiring portion TX1_2a will be described with reference to FIG. 11.

The fourth guard wiring GL4 is disposed between the second touch driving wirings TX1_2 to TX5_2 connected to the upper end of the first touch sensing electrode IE1 and the second antistatic wiring ES2.

Each of the guard wirings GL1 to GL4 is a wiring through which a second reference voltage signal flows. Each of the guard wirings GL1 to GL4 may prevent a signal interference phenomenon that may occur between adjacent wirings.

In an embodiment, the pad terminal unit TPA is disposed on the right side of the lower end of the non-sensing area NAA. The position of the pad terminal unit TPA is not limited thereto, and may vary depending on the electrical connection relationship with the elements other than the touch sensing unit 50a. The pad terminal unit TPA may include pad terminals connected to the touch driving wirings TX1_1 to TX5_1 and TX1_2 to TX5_2, touch sensing wirings RX1_1 to RX8_1, guard wirings GL1 to GL4 and antistatic wirings ES1 and ES2.

Next, a compensation design of the second unit sensing area will be described. For convenience of explanation, a unit sensing area SUT of one row and one column including the first corner EG1, of the second unit sensing area SUT2, will be described as an example.

Figure 11:
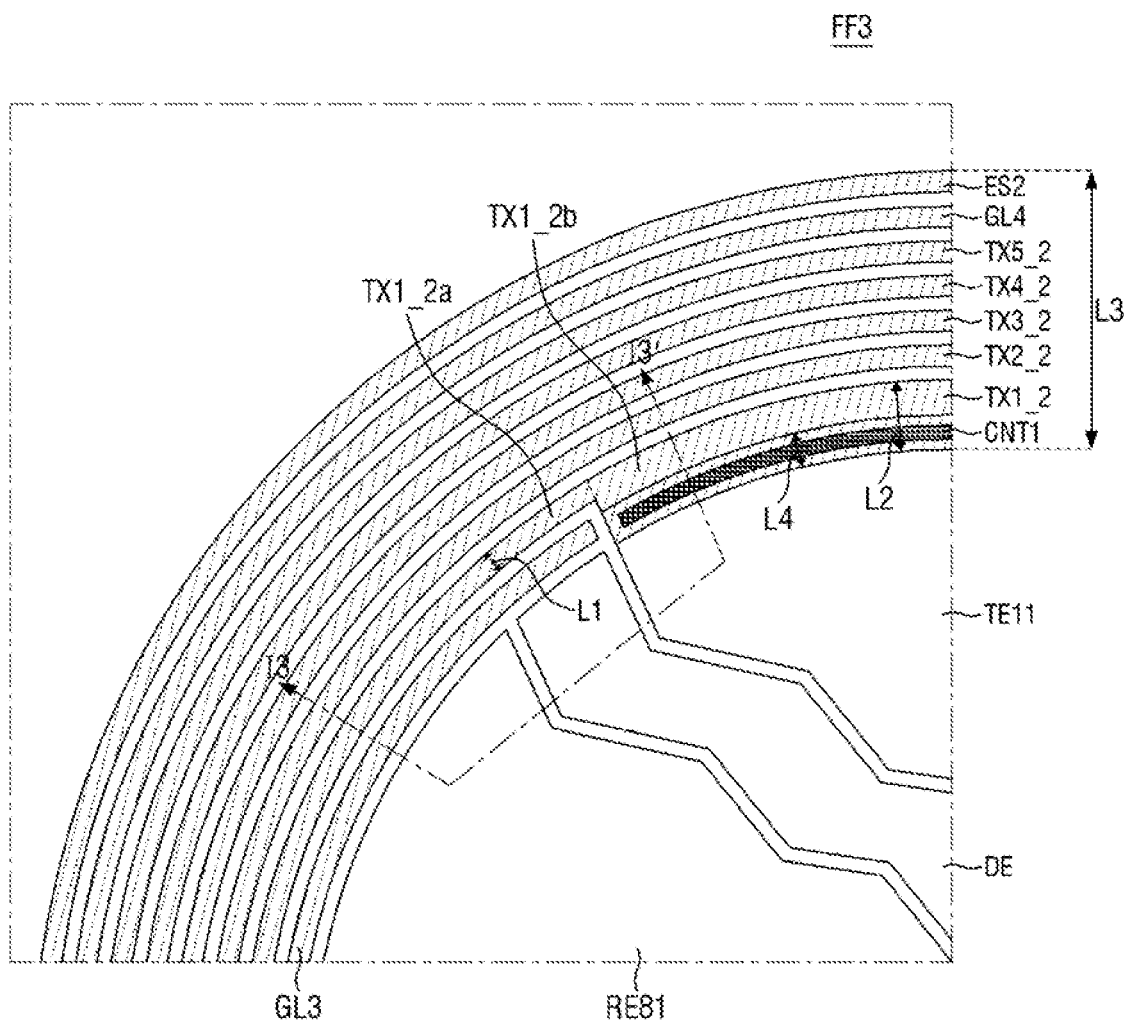
FIG. 11 is an enlarged view of the area FF3 of FIG. 3.
Figure 12:
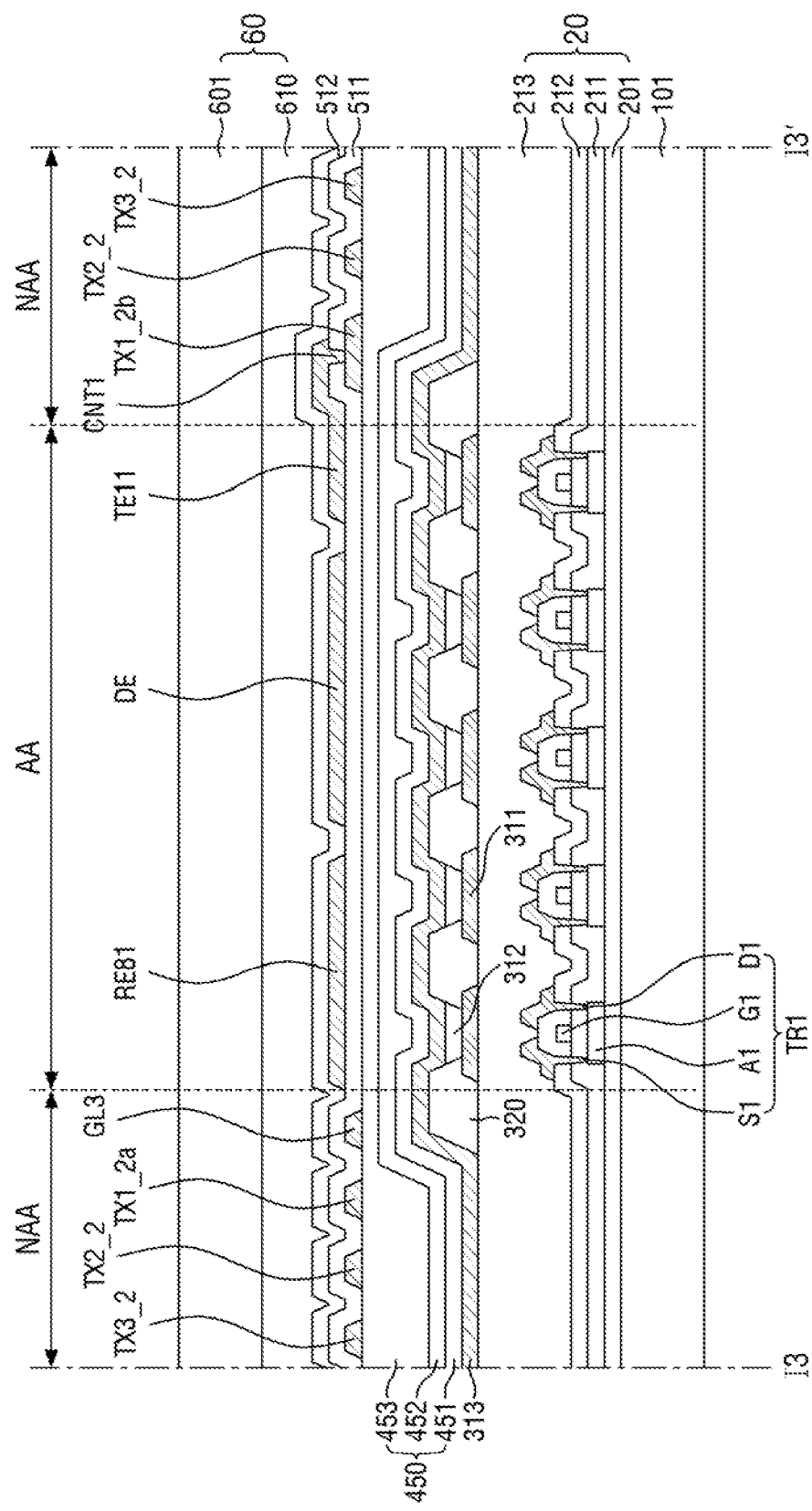
FIG. 12 is a cross-sectional view of an organic light emitting display device taken along the line I3-I3' of FIG. 11.

FIG. 11 is an enlarged view of the area FF3 of FIG. 3. FIG. 12 is a cross-sectional view of an organic light emitting display device taken along the line I3-I3' of FIG. 11.

The first driving electrode pattern TE11 of the first driving electrode TE1 is connected to the first wiring TX1_2 of the second touch driving wirings TX1_2 to TX5_2. The first wiring TX1_2 of the second touch driving wirings TX1_2 to TX5_2 includes a first wiring portion TX1_2a having a first line width L1 and a first junction portion TX1_2b having a second line width L2 larger than the first line width L1. The first junction portion TX1_2b is connected to the first driving electrode pattern TE11 of the first driving electrode TE1.

Like the first wiring TX1_2, each of the second to fifth wirings TX2_2 to TX5_2 of the second touch driving wirings TX1_2 to TX5_2 may include a wiring portion and a junction portion.

The second line width L2 is larger than the sum of the first line width L1 and the line width of the third guard wiring GL3 adjacent to the first wiring TX1_2 of the second touch driving wirings TX1_2 to TX5_2.

In an embodiment, the first line width L1 of the first junction portion TX1_2b may occupy 30% or more of the width L3 of an area where the second touch driving wirings TX1_2 to TX5_2, the fourth guard wiring GL4 and the second antistatic wiring ES2 are disposed at the upper side of the non-sensing area NAA. The total width L3 of the non-sensing area NAA in which the wirings are arranged may be about 250 µm to about 350 µm. The total width L3 may refer to a width occupied by the second touch driving wirings TX1_2 to TX5_2, the fourth guard wiring GL4, and the second antistatic wiring ES2, and may be a width including intervals between the respective wirings.

The first line width L1 of the first wiring portion TX1_2a may be about 15 µm to about 25 µm. The first wiring portion TX1_2a extends from one side of the first junction portion TX1_2b. A portion of the first wiring portion TX1_2a extending along the outside of the first corner EG1 may have a curved shape, a portion of the first wiring portion TX1_2a extending along the left edge of the non-sensing area may have a linear shape, and a portion of the first wiring portion TX1_2a extending along the outside of the third corner EG3 may have a curved shape.

The second line width L2 of the first junction portion TX1_2b may be about 90 µm to about 110 µm. The second line width L2 may be a width occupied by the first junction portion TX1_2b in the normal line direction of the extending direction of the first corner EG1. The first junction portion TX1_2b may include a portion overlapping the first driving electrode pattern TE11 of the first driving electrode TE1 in the thickness direction. The first driving electrode pattern TE11 of the first driving electrode TE1 may be in contact with the overlapped portion of the first junction portion TX1_2b through a first contact hole CNT1 of a first touch insulating layer 511 disposed between the first junction portion TX1_2b and the first driving electrode pattern TE11.

In an embodiment, the first contact hole CNT1 may have a shape extending in a direction similar to the first corner EG1. For example, the first contact hole CNT1 has a shape extending in the normal line of the second line width L2. That is, the first contact hole CNT1 may extend in a direction parallel to the first corner EG1.

In an embodiment, the width L4 of a portion where the first driving electrode pattern TE11 of the first driving electrode TE1 overlaps the first junction portion TX1_2b in the thickness direction may be about 15 µm to about 25 µm, but is not limited thereto.

Referring to FIG. 9, the first driving electrode pattern TE31 of the third driving electrode TE3 may be connected to the third wiring TX3_2 of the second touch driving wirings TX1_2 to TX5_2.

The third wiring TX3_2 of the second touch driving wirings TX1_2 to TX5_2 includes a second wiring portion TX3_2a having a third line width L5 and a second junction portion TX3_2b having a fourth line width L6 larger than the third line width L5. The second junction portion TX3_2b may be connected to a driving bridge electrode portion TE31a of the third driving electrode TE3.

When the first driving electrode pattern TE31 of the third driving electrode TE3 is cut off by the sensing area AA, the area ratio in the unit sensing area (SUT) is less than 1, so that a compensation design may be required. For this purpose, the fourth line width L6 may be adjusted.

The fourth line width L6 is larger than the width L7 of a portion where the driving bridge electrode portion TE31a and the second junction portion TX3_2b overlap each other. Further, in an embodiment, the fourth wiring width L6 may be equal to or less than the second wiring width L2.

Hereinafter, a connection relationship of a laminate structure of the touch sensing unit 50a and other members of the organic light emitting display device 1 will be described with reference to FIGS. 2, 7, 10, and 12.

The touch layer 50 including the touch sensing unit 50a includes a first touch conductive layer, a first touch insulating layer 511, a second touch conductive layer, and a second touch insulating layer 512, which are sequentially disposed on the encapsulation layer 40.

The first touch conductive layer is disposed on the encapsulation layer 40. For example, the first touch conductive layer may be disposed on a second inorganic film 453 to be described later. The first touch conductive layer may include at least one selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first touch conductive layer may be a single-layer film or a multi-layer film.

As described above, the first touch conductive layer may include the bridge wirings BE1 and BE2, the touch driving wirings TX1_1 to TX5_1 and TX1_2 to TX5_2, the touch sensing wirings RX1_1 to RX8_1, the connection wiring RX1_2, the guard wirings GL1 to GL4, and the antistatic wirings ES1 and ES2. That is, the bridge wirings BE1 and BE2, the touch driving wirings TX1_1 to TX5_1 and TX1_2 to TX5_2, the touch sensing wirings RX1_1 to RX8_1, the guard wirings GL1 to GL4, and the antistatic wirings ES1 and ES2 may be disposed on the same layer, and may include the same material.

The first touch insulating layer 511 is disposed on the first touch conductive layer. As described above, the first touch insulating layer 511 may include a plurality of contact holes CNT1, CNT2, and CNT3 exposing a part of each of the bridge wirings BE1 and BE2, the touch driving wirings TX1_1 to TX5_1 and TX1_2 to TX5_2, and the touch sensing wirings RX1_1 to RX8_1.

In an embodiment, the first touch insulating layer 511 may be disposed over the entire surface of the substrate 10 in FIG. 2, but the present invention is not limited thereto. The first insulating layer may include silicon oxide (SiOx), silicon nitride (SiNx), silicon oxynitride, aluminum oxide, tantalum oxide, hafnium oxide, zirconium oxide, or titanium oxide. These may be used alone or in combination with each other. The first touch insulating layer 511 may be a single-layer film or a multi-layer film including a lamination layer of different materials.

The second touch conductive layer is disposed on the first touch insulating layer 511. The second touch conductive layer may include a transparent conductive oxide such as ITO (indium tin oxide), IZO (indium zinc oxide), ZnO (zinc oxide), or ITZO (indium tin zinc oxide).

The second touch conductive layer may include a first touch sensing electrode IE1, a second touch sensing electrode IE2, a dummy electrode DE, and island electrodes IS1 and IS2, each including the aforementioned driving bridge electrode portion (for example, TE31a). The first touch sensing electrode IE1, the second touch sensing electrode IE2, the dummy electrode DE, and the island electrodes IS1 and IS2 may be disposed on the same layer, and may include the same material.

One end and/or the other end of the first touch sensing electrode IE1 and the second touch sensing electrode IE2 may be connected to the respective corresponding touch driving wirings TX1_1 to TX5_1 and TX1_2 to TX5_2 and the touch sensing wirings RX1_1 to RX8_1 through the plurality of contact holes (for example, CNT1 and CNT2) formed in the first touch insulating layer 511.

The second touch insulating layer 512 is disposed on the second touch conductive layer. The second touch insulating layer 512 may include the same material as the first touch insulating layer 511. However, the present invention is not limited thereto, and the second touch insulating layer 512 may be formed of one of the materials exemplified in the first touch insulating layer 511 or a combination of the exemplified materials. The second touch insulating layer 512 may be a single-layer film or a multi-layer film including a lamination layer of different materials.

In an embodiment, the second touch insulation layer 512 may be a planarizing film for planarizing the surface of the touch sensing unit 50a, but in another embodiment, the touch sensing unit 50a may further be provided thereon with a planarizing film for planarizing the surface of the touch sensing unit 50a.

A base substrate 101 may be a rigid or flexible substrate. For example, when the base substrate 101 is a rigid substrate, the base substrate 101 may include a glass substrate, a quartz substrate, a glass ceramic substrate, or a crystalline glass substrate. When the base substrate 101 is a flexible substrate, the base substrate 101 may be a film substrate including a polymer organic material or a plastic material.

The base substrate 101 may be provided with the display area DA, non-display area NDA, sensing area AA, and non-sensing area NAA.

The base substrate 101 shown in FIGS. 7, 10 and 12 may correspond to the substrate 10 of FIG. 2.

A buffer layer 201 is disposed on the base substrate 101. The buffer layer 201 may serve to provide a planarized surface for a plurality of thin film transistors to be formed on the base substrate 101 and prevent the penetration of moisture or outside air. The buffer layer 201 may be an inorganic film. The buffer layer 201 may be a single-layer film or a multi-layer film.

The plurality of thin film transistors (for example, TR1) are disposed on the buffer layer 201. Here, the plurality of thin film transistors TR1 may be driving thin film transistors. The number of the thin film transistors TR1 may be three or more, for example. Each pixel may include at least one thin film transistor TR1. In an exemplary embodiment, each pixel may be, but is not limited to, one of a red pixel, a green pixel, and a blue pixel. In another embodiment, each pixel may be a cyan pixel, a magenta pixel, or a yellow pixel instead of the red pixel, the green pixel, or the blue pixel.

Each thin film transistor TR1 may include a semiconductor layer (for example, A1), a gate electrode (for example, G1), a source electrode (for example, S1), and a drain electrode (for example, D1). More specifically, the semiconductor layer A1 is disposed on the buffer layer 201. The semiconductor layer A1 may include amorphous silicon, poly silicon, low-temperature poly silicon, and an organic semiconductor. In another embodiment, the semiconductor layer A1 may include an oxide semiconductor. Although not clearly shown, the semiconductor layer A1 may include a channel region, and source and drain regions disposed on both sides of the channel region and doped with impurities.

A gate insulating film 211 is disposed on the semiconductor layer A1. The gate insulating film 211 may be an inorganic film. The gate insulating film 211 may be a single-layer film or a multi-layer film.

The gate electrode G1 is disposed on the gate insulating film 211. The gate electrode G1 may be formed of a conductive metal material. For example, the gate electrode G1 may include molybdenum (Mo), aluminum (Al), copper (Cu), or titanium (Ti). The gate electrode G1 may be a single-layer film or a multi-layer film.

The interlayer insulating film 212 is disposed on the gate electrode G1. The interlayer insulating film 212 may be an inorganic film. The interlayer insulating film 212 may be a single-layer film or a multi-layer film.

The source electrode S1 and the drain electrode D1 are disposed on the interlayer insulating film 212. The source electrode S1 and the drain electrode D1 may be formed of a conductive metal material. For example, the source electrode S1 and the drain electrode D1 may include aluminum (Al), copper (Cu), titanium (Ti), or molybdenum (Mo).

The source electrode S1 and the drain electrode D1 may be electrically connected to the source region and drain region of the semiconductor layer A1 through a contact hole penetrating the interlayer insulating film 212 and the gate insulating film 211.

Although not shown, the organic light emitting display device 1 may further include a storage capacitor and a switch thin film transistor on the base substrate 101.

A protective layer 213 is disposed on the source electrode S1, the drain electrode D1, and the interlayer insulating film 212. Here, the protective layer 213 is disposed to cover a pixel circuit unit including the thin film transistor TR1. The protective layer 213 may be a passivation film or a planarizing film. The passivation film may include $SiO_2$, SiNx, or the like, and the planarizing film may include a material such as acrylate or polyimide. The protective layer 213 may include both the passivation film and the planarizing film. In this case, the passivation film may be disposed on the source electrode S1, the drain electrode D1, and the interlayer insulating film 212, and the planarization film may be disposed on the passivation film. The upper surface of the protective layer 213 may be flat.

The stacked structure of the buffer layer 201, the gate insulating film, the interlayer insulating film 212 and the protective layer 213, shown in FIGS. 7, 10, and 12, may correspond to the circuit layer 20 of FIG. 2. The stacked structure may also include the thin film transistor TR1.

A plurality of first pixel electrodes 311 are disposed on the protective layer 213. The first pixel electrode 311 may be a pixel electrode disposed for each pixel. The first pixel electrode 311 may be an anode electrode of an organic light emitting diode.

The first pixel electrode 311 may be electrically connected to the drain electrode D1 (or the source electrode S1) disposed on the base substrate 101 through a via hole penetrating the protective layer 213.

The first pixel electrode 311 may include a material having a high work function. The first pixel electrode 311 may include indium-tin-oxide (ITO), indium-zinc-oxide (IZO), zinc oxide (ZnO) indium oxide ($In_2O_3$), or the like.

A pixel defining layer 320 is disposed on the first pixel electrode 311. The pixel defining layer 320 includes an opening for exposing at least a part of the first pixel electrode 311. The pixel defining layer 320 may include an organic material or an inorganic material. In an embodiment, the pixel defining layer 320 may include a material such as a photoresist, a polyimide resin, an acrylic resin, a silicon compound, or a polyacrylic resin.

An organic light emitting element layer 312 is disposed on the first pixel electrode 311 exposed by the pixel defining layer 320.

A second pixel electrode 313 is disposed on the organic light emitting element layer 312. The second pixel electrode 313 may be a common electrode disposed over the entire of the pixels. The second pixel electrode 313 may be a cathode electrode of an organic light emitting diode.

The second pixel electrode 313 may include a material having a low work function. The second pixel electrode 313 may include Li, Ca, LiF/Ca, LiF/Al, Al, Mg, Ag, Pt, Pd, Ni, Au, Nd, Ir, Cr, BaF, Ba, a compound thereof, or a mixture thereof (for example, a mixture of Ag and Mg). The second pixel electrode 313 may be connected to a power supply line through an electrode formed on the same layer as the first pixel electrode 311.

The first pixel electrode 311, organic light emitting element layer 312, and second pixel electrode 313 may constitute an organic light emitting diode.

The first pixel electrode 311 to the second pixel electrode 313, shown in FIGS. 7, 10, and 12, may correspond to the light emitting element layer 30 of FIG. 2.

An encapsulation layer 450 is disposed on the second pixel electrode 313. The encapsulation layer 450 includes an inorganic film and an organic film. The encapsulation layer 450 may include a plurality of laminate films. As shown in the drawing, the encapsulation layer 450 may be formed of a multilayer film including a first inorganic film 451, an organic film 452, and a second inorganic film 453, which are sequentially laminated. Here, the first inorganic film 451 and the second inorganic film 453 may include at least one selected from the group consisting of silicon oxide (SiOx), silicon nitride (SiNx), and silicon oxynitride (SiONx), and the organic film 452 may include any one selected from the group consisting of epoxy, acrylate, and urethane acrylate.

The encapsulation layer 450, shown in FIGS. 7, 10, and 12, may correspond to the encapsulation layer 40 of FIG. 2.

The touch sensing unit 50a is disposed on the encapsulation layer 450.

A window member 601 is disposed on the touch layer 50. The window member 601 may protect the light emitting element layer 30, the circuit layer 20, or the touch layer 50 from external scratches or the like. The window member 601 may be attached to the touch layer 50 by an adhesive member 610 such as optically clear adhesive (OCA) or optically clear resin (OCR).

The window member 601 and the adhesive member 610, shown in FIGS. 7, 10 and 12, may correspond to the cover layer 60 of FIG. 2.

Although not shown, an optical member such as an antireflective film or a polarizing film may be disposed over or under the window member 601.

Next, an organic light emitting display device according to another embodiment will now be described. Hereinafter, the same components as those in FIGS. 1 to 12 are not described, and the same or similar reference numerals are used.

Figure 13:
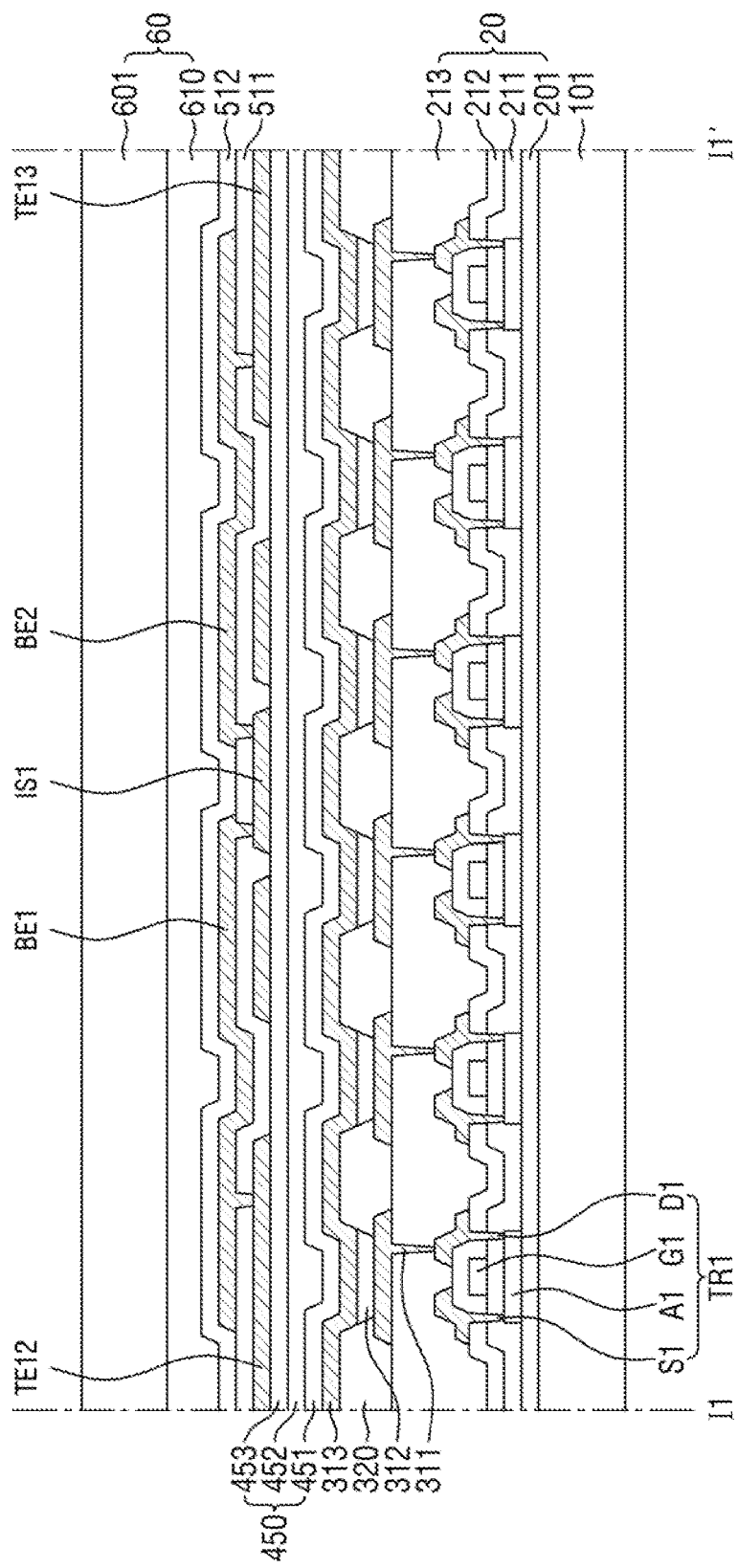
FIGS. 13 to 15 are cross-sectional views of parts of organic light emitting display devices according to other embodiments.
Figure 14:
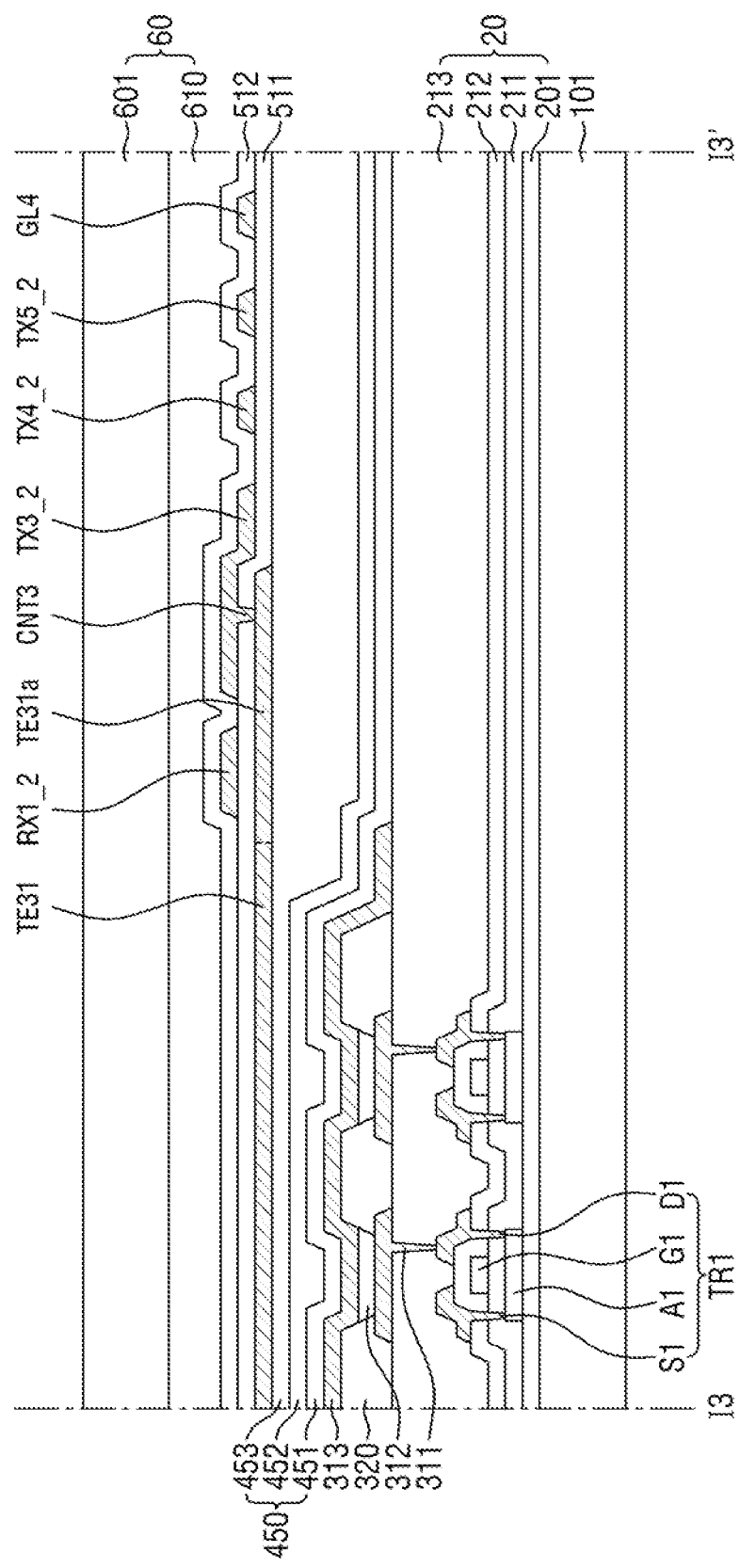
Figure 15:
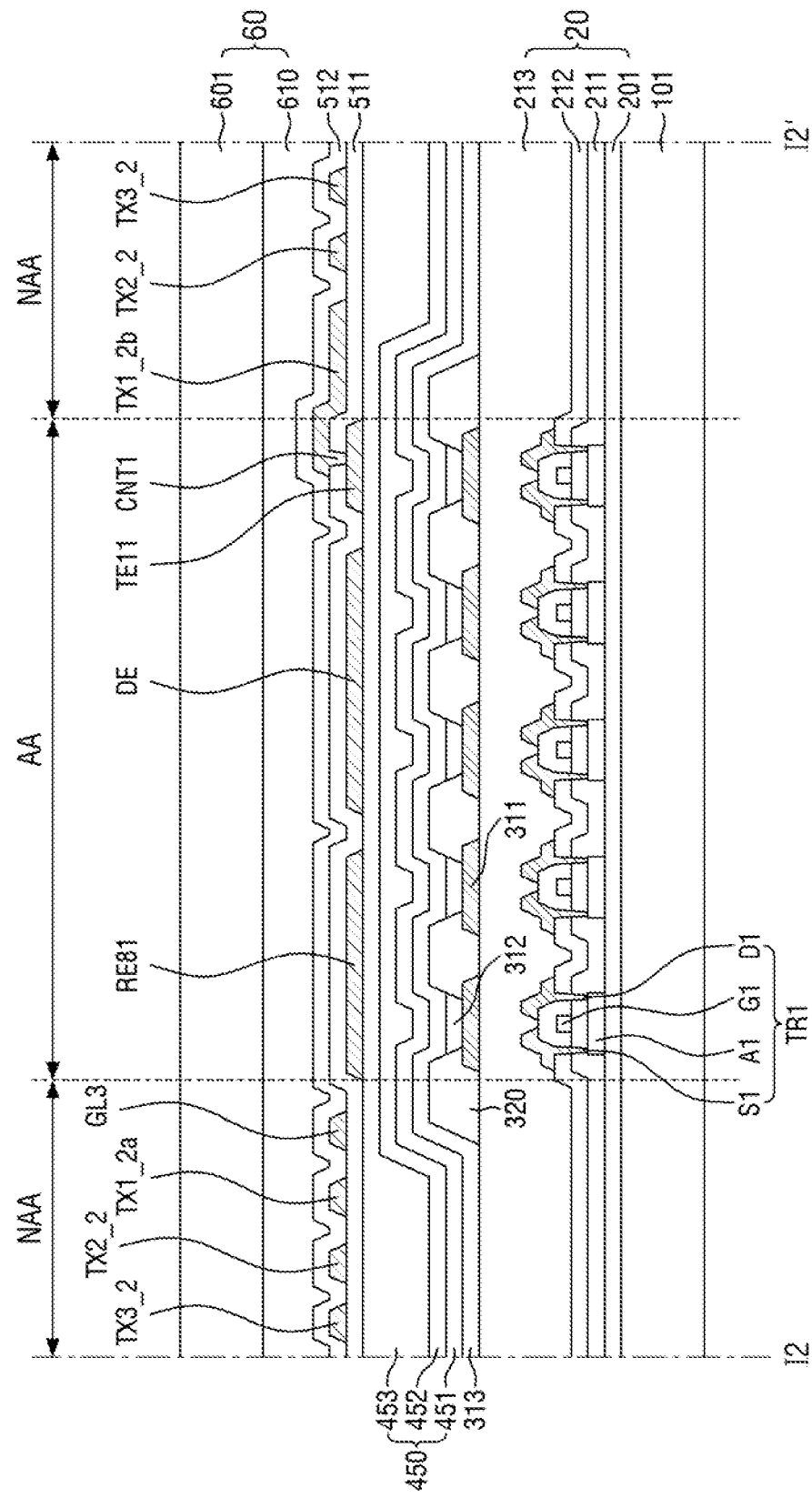

FIGS. 13 to 15 are cross-sectional views of parts of organic light emitting display devices according to other embodiments.

FIGS. 13 to 15 are modification examples of FIGS. 7, 10, and 12, respectively.

Referring to FIGS. 13 to 15, an organic light emitting display device 2 according to the present embodiment includes first and second touch conductive layers different from those of the organic light emitting display device 1 of FIGS. 7, 10, and 12.

The first touch conductive layer may be disposed on the encapsulation layer 450. The first touch conductive layer may include a transparent conductive oxide such as ITO (indium tin oxide), IZO (indium zinc oxide), ZnO (zinc oxide), ITZO (indium tin zinc oxide).

The first touch conductive layer may include a first touch sensing electrode IE1, a second touch sensing electrode IE2, a dummy electrode DE, and island electrodes IS1 and IS2, each including the aforementioned driving bridge electrode portion (for example, TE31a). The first touch sensing electrode IE1, the second touch sensing electrode IE2, the dummy electrode DE, and the island electrodes IS1 and IS2 may be disposed on the same layer, and may include the same material.

The first touch insulating layer 511 is disposed on the first touch conductive layer. The first touch insulating layer 511 may include a plurality of contact holes CNT1, CNT2, and CNT3 for exposing a part of each of the first touch sensing electrode IE1, the second touch sensing electrode IE2, the dummy electrode DE, and the island electrodes IS1 and IS2, each including the aforementioned driving bridge electrode portion TE 31a.

The second touch conductive layer may be disposed on the first touch insulating layer 511. The second touch conductive layer may include at least one selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second touch conductive layer may be a single-layer film or a multi-layer film.

The second touch conductive layer may include the bridge wirings BE1 and BE2, the touch driving wirings TX1_1 to TX5_1 and TX1_2 to TX5_2, the touch sensing wirings RX1_1 to RX8_1, the connection wiring RX1_2, the guard wirings GL1 to GL4, and the antistatic wirings ES1 and ES2. For example, the bridge wirings BE1 and BE2, the touch driving wirings TX1_1 to TX5_1 and TX1_2 to TX5_2, the touch sensing wirings RX1_1 to RX8_1, the guard wirings GL1 to GL4, and the antistatic wirings ES1 and ES2 may be disposed on the same layer, and may include the same material.

A window member 601 may be disposed on the second touch conductive layer. The window member 601 may be attached to the second touch conductive layer by an adhesive member 610.

Figure 16:
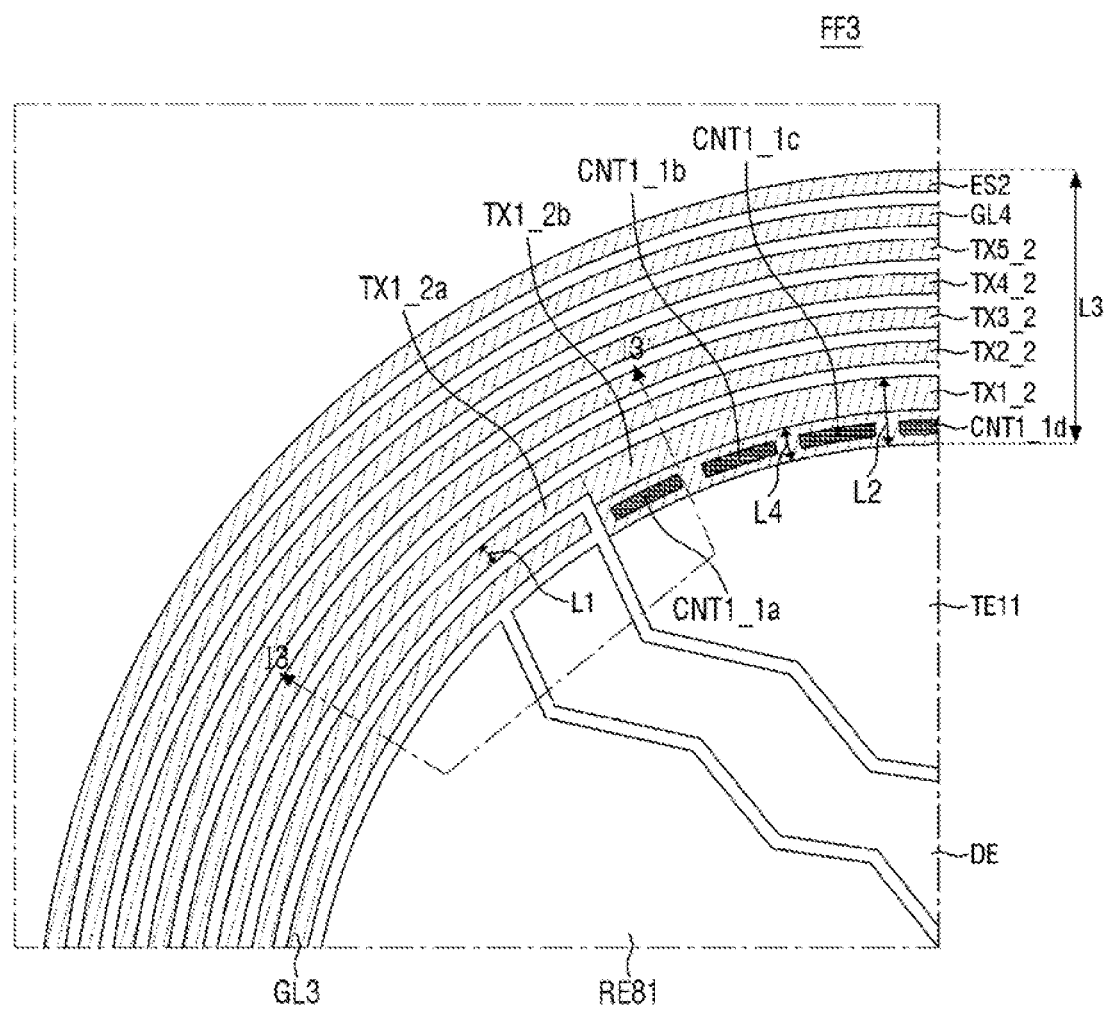
FIG. 16 is an enlarged view of a part of an organic light emitting display device according to another embodiment.

FIG. 16 is an enlarged view of a part of an organic light emitting display device according to another embodiment. FIG. 16 is a modification example of FIG. 11.

Referring to FIG. 16, an organic light emitting layer according to the present embodiment is different from the organic light emitting display device of FIG. 11 in that the first contact hole CNT1 is divided.

The first contact hole CNT1 may include first to fourth sub-contact holes CNT1_1a to CNT1_1d. For example, the first touch insulating layer 511 may include first to fourth sub-contact holes CNT1_1a to CNT1_1d that expose the first junction portion TX1_2b of the first wiring TX1_2 of the second touch driving wirings TX1_2 to TX5_2.

In the first touch insulating layer 511, the first wiring TX1_2 of the second touch driving wirings TX1_2 to TX5_2 may be in contact with the first driving electrode pattern TE11 of the first driving electrode TE1 through the first to fourth sub-contact holes CNT1_1a to CNT1_1d.

Even when one (for example, CNT1_1a) of the plurality of contact holes CNT1_1a to CNT1_1d is disconnected, the first touch insulating layer 511 may be electrically connected to the first wiring TX1_2 of the second touch driving wirings TX1_2 to TX5_2 and the first driving electrode pattern TE11 of the first driving electrode TE by the other contact holes (for example, CNT1_1b to CNT1_1d).

Figure 17:
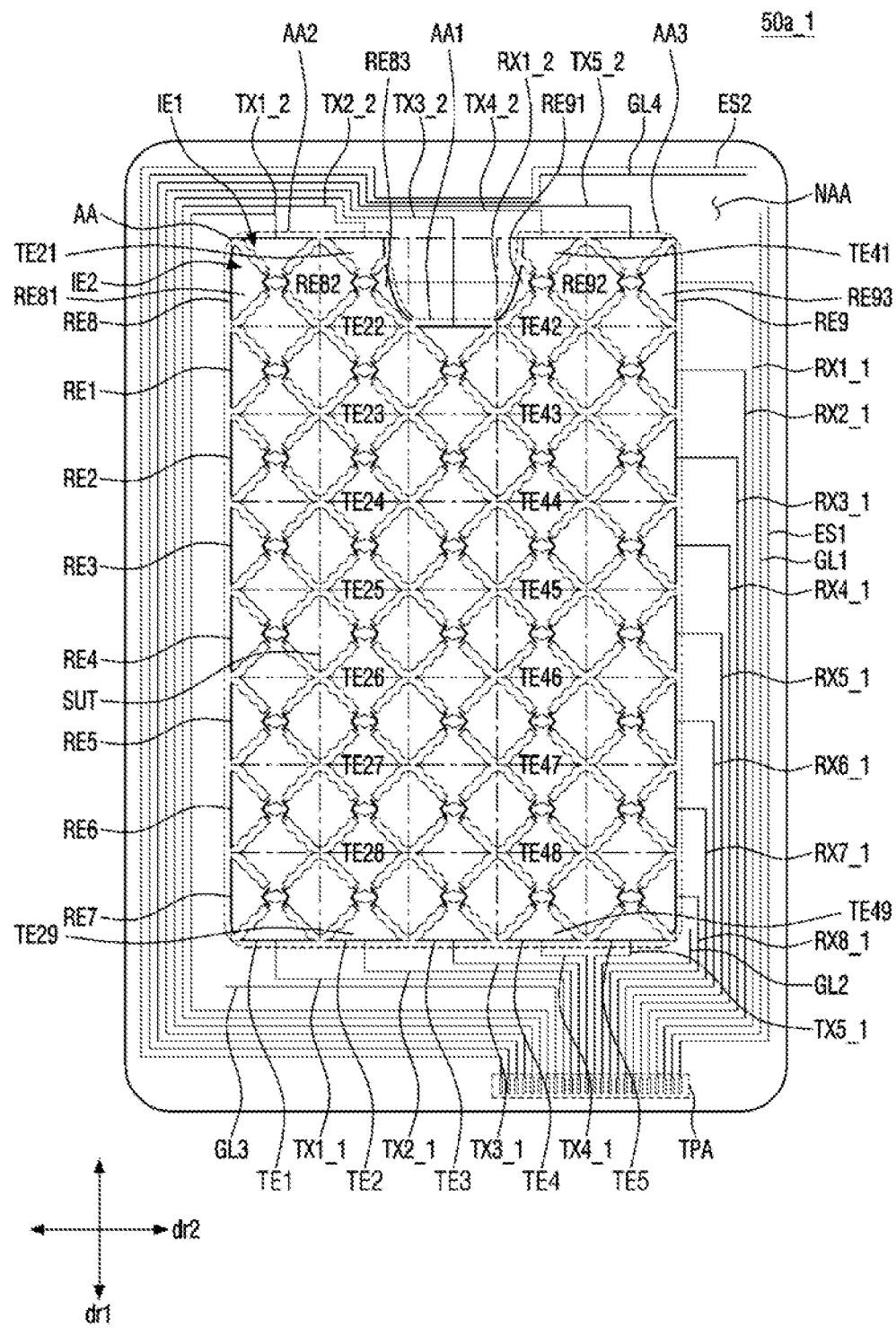
FIG. 17 is a plan view schematically showing a layout structure of a touch sensing unit for an organic light emitting display device according to another embodiment.

FIG. 17 is a plan view schematically showing a layout structure of a touch sensing unit for an organic light emitting display device according to another embodiment.

Referring to FIG. 17, an organic light emitting display device according to the present embodiment is different from the organic light emitting display device of FIG. 3 in that a touch sensing unit 50a_1 has different types of sensing electrode units IE1 and IE2 as compared with the touch sensing unit 50a. The touch sensing unit 50a_1 included in the organic light emitting display device according to the present embodiment may be configured such that the second sensing area AA2 and the third sensing area AA3 may be wider in the second direction dr2 as compared with those shown in FIG. 3.

The length of each of the second driving electrode TE2 and the fourth driving electrode TE4 in the first direction dr1 may be equal to the length of each of the first driving electrode TE1 and the fifth driving electrode TE5 in the first direction dr1.

The second driving electrode TE2 may include first to ninth driving electrode patterns TE21 to TE29. The first driving electrode pattern TE21 of the second driving electrode TE2 may be disposed in the second sensing area AA2. The second driving electrode pattern TE22 of the second driving electrode TE2 may be disposed over both the second sensing area AA2 and the first sensing area AA1. The third to ninth driving electrode patterns TE23 to TE29 of the second driving electrode IE2 may be disposed in the first sensing area AA1.

The fourth driving electrode TE4 may include first to ninth driving electrode patterns TE41 to TE49. The first driving electrode pattern TE41 of the fourth driving electrode TE4 may be disposed in the third sensing area AA3. The second driving electrode pattern TE42 of the fourth driving electrode TE4 may be disposed over both the third sensing area AA3 and the first sensing area AA1. The third to ninth driving electrode patterns TE43 to TE49 of the fourth driving electrode TE4 may be disposed in the first sensing area AA1.

The eighth sensing electrode RE8 may traverse the first driving electrode TE1 and the second driving electrode TE2. The eighth sensing electrode RE8 may include first to third sensing electrode patterns RE81 to RE83. The second sensing electrode pattern RE82 and third sensing electrode pattern RE83 of the eighth sensing electrode RE8 may be traversed between the first driving electrode TE21 and second driving electrode pattern TE22 of the second driving electrode TE2.

The ninth sensing electrode RE9 may traverse the fourth driving electrode TE4 and the fifth driving electrode TE5. The ninth sensing electrode RE9 may include first to third sensing electrode patterns RE91 to RE93. The first sensing electrode pattern RE91 and second sensing electrode pattern RE92 of the ninth sensing electrode RE9 may be traversed between the first driving electrode TE41 and second driving electrode pattern TE42 of the fourth driving electrode TE4. The second sensing electrode pattern RE92 and third sensing electrode pattern RE93 of the ninth sensing electrode RE9 may be traversed between the first driving electrode TE51 and second driving electrode pattern TE52 of the fifth driving electrode TE5.

The third sensing electrode pattern RE83 of the eighth sensing electrode RE8 may be connected to the first sensing electrode pattern RE91 of the ninth sensing electrode RE9 through a connection wiring RX1_2.

The area ratio in the unit sensing area SUT of first row second column and first row and fourth column may be less than 1. Thus, a compensation design for improving touch sensitivity is required, and the junction portion of each of the second and fourth wirings TX2_2 and TX4_2 of the second touch driving wirings TX1_2 to TX5_2 may have a line width larger than that of the wiring portion.

Figure 18:
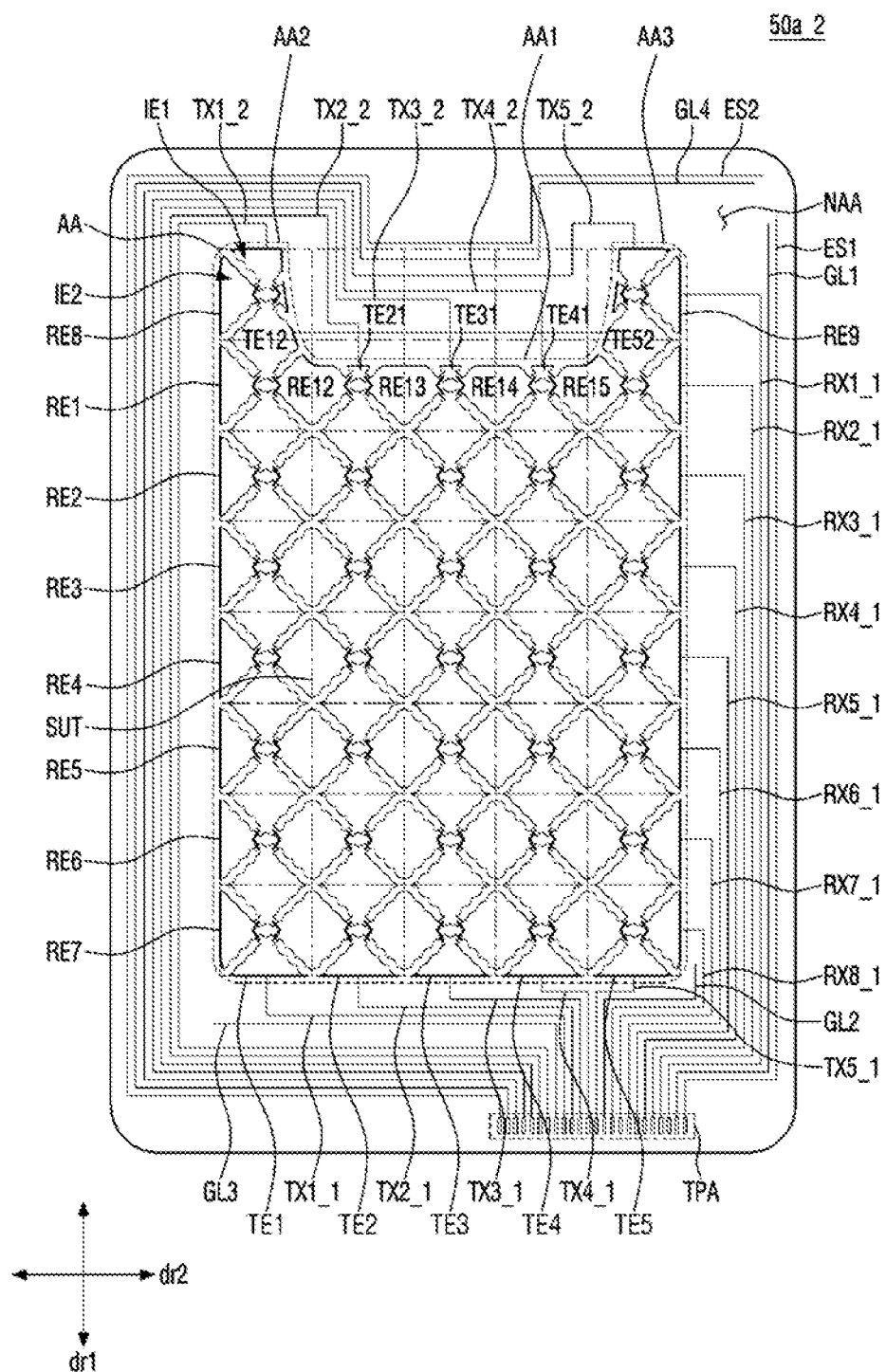
FIG. 18 is a plan view schematically showing a layout structure of a touch sensing unit for an organic light emitting display device according to another embodiment.

FIG. 18 is a plan view schematically showing a layout structure of a touch sensing unit for an organic light emitting display device according to another embodiment.

Referring to FIG. 18, an organic light emitting display device according to the present embodiment is different from the organic light emitting display device of FIG. 3 in that a touch sensing unit 50a_2 has different types of sensing electrode units as compared with the touch sensing unit 50a. The touch sensing unit 50a_2 included in the organic light emitting display device according to the present embodiment is different from the touch sensing unit 50a of FIG. 3 in that one atypical edge of the sensing area AA is relatively deeply indented into the sensing area AA.

The second driving electrode TE2, each driving electrode pattern of the fourth driving electrode TE4, and each sensing electrode pattern of the second sensing electrode RE2, shown in FIG. 3, may be partially cut off by a boundary of the sensing area AA and the non-sensing area NAA.

Therefore, the area ratio in the unit sensing area SUT of second row and second to fourth columns may be less than 1. Thus, a compensation design for improving touch sensitivity is required, and the junction portion of each of the second to fourth wirings TX2_2 to TX4_2 of the second touch driving wirings TX1_2 to TX5_2 may have a line width larger than that of the wiring portion.

As described above, according to the embodiments of the present invention, in the display device where the touch activating area has round corners or has a notch or trench shape, touch signals may be effectively sensed.

The effects of the present invention are not limited by the foregoing, and other various effects are anticipated herein.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. A display device comprising:
a base layer including a sensing area with rounded corners and a non-sensing area surrounding the sensing area;
a plurality of driving electrode patterns disposed in the sensing area and arranged in a first direction;
a plurality of sensing electrode patterns disposed in the sensing area and arranged in a second direction intersecting the first direction;
a plurality of touch sensing wirings which are disposed in the non-sensing area, wherein each of the plurality of touch sensing wirings is connected to one of the plurality of sensing electrode patterns; and
a plurality of touch driving wirings disposed in the non-sensing area, wherein each of the plurality of touch driving wirings is connected to one of the plurality of driving electrode patterns, wherein the plurality of driving electrode patterns include a first driving electrode pattern disposed adjacent to a first rounded corner of the rounded corners, wherein the plurality of sensing electrode patterns include a first sensing electrode pattern adjacent to the first rounded corner and adjacent to the first driving electrode pattern, wherein the first driving electrode pattern has a first curved outer boundary line extending a long the first rounded corner, wherein the first sensing electrode pattern has a second curved outer boundary line extending a long the first rounded corner, wherein the plurality of touch driving wirings includes:

a first touch driving wiring including a first junction portion connected to the first driving electrode pattern and overlapping the rounded portion of the first driving electrode pattern in a thickness direction thereof, and a first wiring portion extending from a second side surface of the first junction portion and bypassing the sensing area;

a second touch driving wiring including a second junction portion and connected to a second driving electrode pattern among the plurality of driving electrode patterns, the second junction portion disposed adjacent to an upper recessed portion of the sensing area and overlapping the second driving electrode pattern in a thickness direction thereof, wherein the upper recessed portion is connected to the first rounded corner and is indented toward an inside of the sensing area relative to the first rounded corner;

a third touch driving wiring most adjacent to the first junction portion of the first touch driving wiring; and a fourth touch driving wiring most adjacent to the second junction portion of the second touch driving wiring, and wherein a first shortest distance between the first junction portion and the third touch driving wiring is smaller than a second shortest distance between the second junction portion and the fourth touch driving wiring.

* * * * *